(12) United States Patent
Hirayama et al.

(10) Patent No.: US 9,095,039 B2
(45) Date of Patent: Jul. 28, 2015

(54) PLASMA PROCESSING APPARATUS AND PLASMA PROCESSING METHOD

(75) Inventors: Masaki Hirayama, Sendai (JP); Tadahiro Ohmi, Sendai (JP)

(73) Assignees: TOHOKU UNIVERSITY, Sendai-Shi (JP); TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 13/809,990

(22) PCT Filed: Jul. 14, 2011

(86) PCT No.: PCT/JP2011/066077
§ 371 (c)(1),
(2), (4) Date: Feb. 18, 2013

(87) PCT Pub. No.: WO2012/008521
PCT Pub. Date: Jan. 19, 2012

(65) Prior Publication Data
US 2013/0140984 A1    Jun. 6, 2013

(30) Foreign Application Priority Data
Jul. 15, 2010    (JP) ................................. 2010-160449

(51) Int. Cl.
*H01J 7/46* (2006.01)
*H05H 1/46* (2006.01)
*H01J 37/32* (2006.01)

(52) U.S. Cl.
CPC ............. *H05H 1/46* (2013.01); *H01J 37/32082* (2013.01); *H01J 37/32183* (2013.01); *H01J 37/32532* (2013.01); *H01J 37/32577* (2013.01)

(58) Field of Classification Search
CPC .... H01J 65/044; Y02B 20/22; H05B 41/2806

USPC ........................ 315/39, 111.21; 156/345.41
See application file for complete search history.

(56) References Cited

U.S. PATENT DOCUMENTS 5,300,901 A * 4/1994 Krummel et al. ......... 333/99 PL
6,264,852 B1 * 7/2001 Herchen et al. ................ 216/60
(Continued)

FOREIGN PATENT DOCUMENTS

JP    61-163704 A    7/1986
JP    09-312268 A    12/1997
(Continued)

OTHER PUBLICATIONS

International Search Report for PCT/JP2011/066077 dated Aug. 30, 2011.

*Primary Examiner* — Douglas W Owens
*Assistant Examiner* — Srinivas Sathiraju
(74) *Attorney, Agent, or Firm* — Pearne & Gordon LLP

(57) ABSTRACT

A plasma processing apparatus can excite uniform plasma on a large substrate. The plasma processing apparatus 10 includes a vacuum chamber 100 having therein a mounting table 115 configured to mount a substrate G, and a plasma space, formed above the mounting table, in which plasma is generated; a first coaxial waveguide 225 through which a high frequency power for exciting plasma is supplied into the vacuum chamber 100; a waveguide path 205, connected to the first coaxial waveguide 225, having a slit-shaped opening toward the plasma space; and an adjusting unit configured to adjust a wavelength of the high frequency power propagating in the waveguide path in a lengthwise direction of the slit-shaped opening. By adjusting the wavelength of the high frequency power propagating in the waveguide path to be sufficiently lengthened, uniform plasma can be excited on the large substrate.

14 Claims, 20 Drawing Sheets

(56) References Cited

U.S. PATENT DOCUMENTS

| | | | |
|---|---|---|---|
| 7,723,637 B2 * | 5/2010 | Ohmi et al. | 219/121.43 |
| 8,327,796 B2 * | 12/2012 | Hirayama et al. | 118/723 MW |
| 8,568,556 B2 * | 10/2013 | Hirayama et al. | 156/345.41 |
| 8,647,585 B2 * | 2/2014 | Hancock | 422/186 |
| 2002/0004309 A1 * | 1/2002 | Collins et al. | 438/719 |
| 2008/0006371 A1 * | 1/2008 | Muraoka et al. | 156/345.41 |
| 2010/0170872 A1 * | 7/2010 | Hirayama et al. | 216/67 |
| 2011/0121736 A1 * | 5/2011 | Hirayama et al. | 315/111.41 |
| 2011/0265952 A1 * | 11/2011 | Muraoka et al. | 156/345.41 |
| 2013/0112352 A1 * | 5/2013 | Hirayama et al. | 156/345.41 |
| 2013/0140984 A1 * | 6/2013 | Hirayama et al. | 315/39 |

FOREIGN PATENT DOCUMENTS

| | | |
|---|---|---|
| JP | 11-204296 A | 7/1999 |
| JP | 2009-021256 A | 1/2009 |
| WO | 2006/120904 A1 | 11/2006 |

* cited by examiner

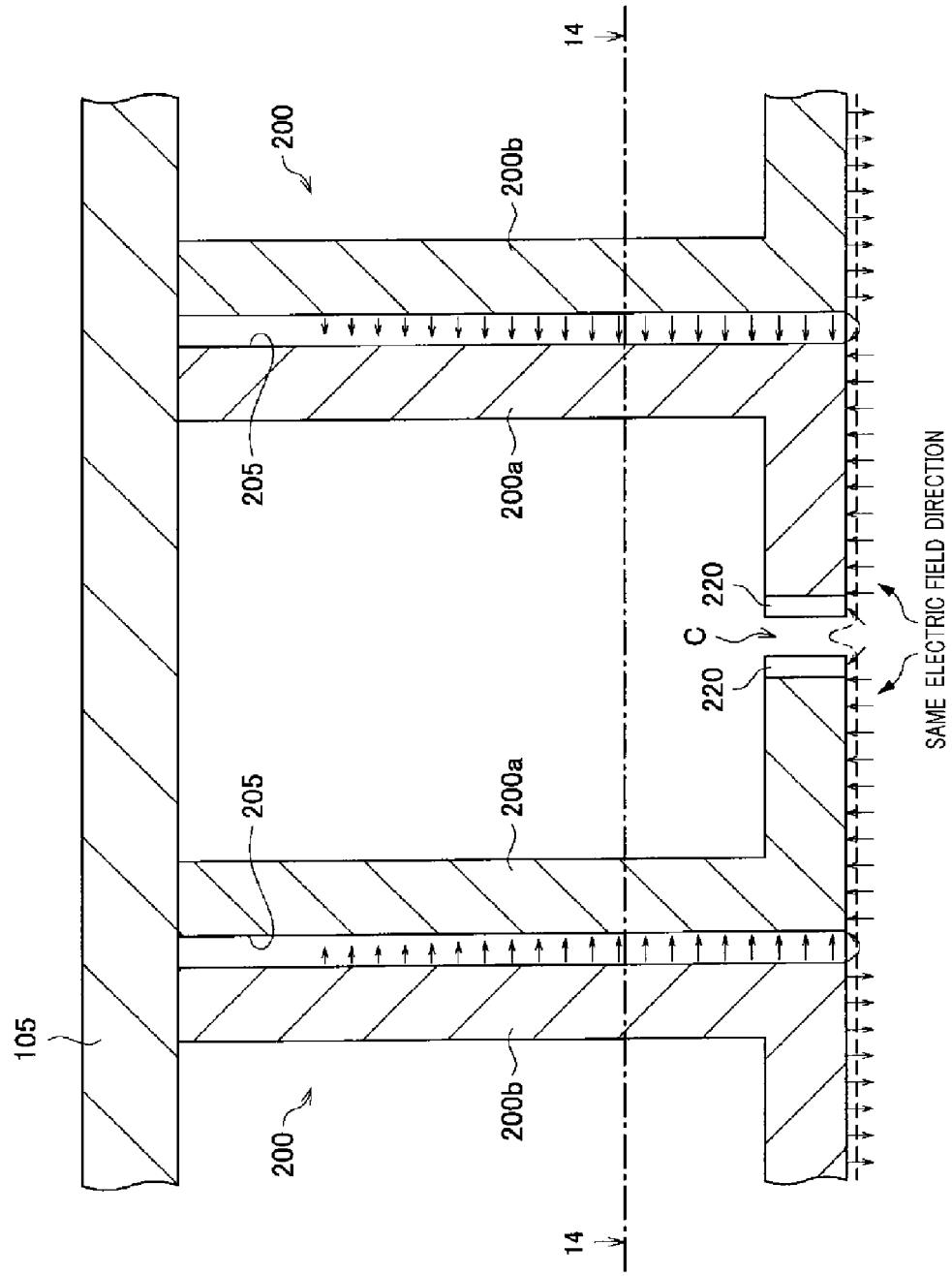

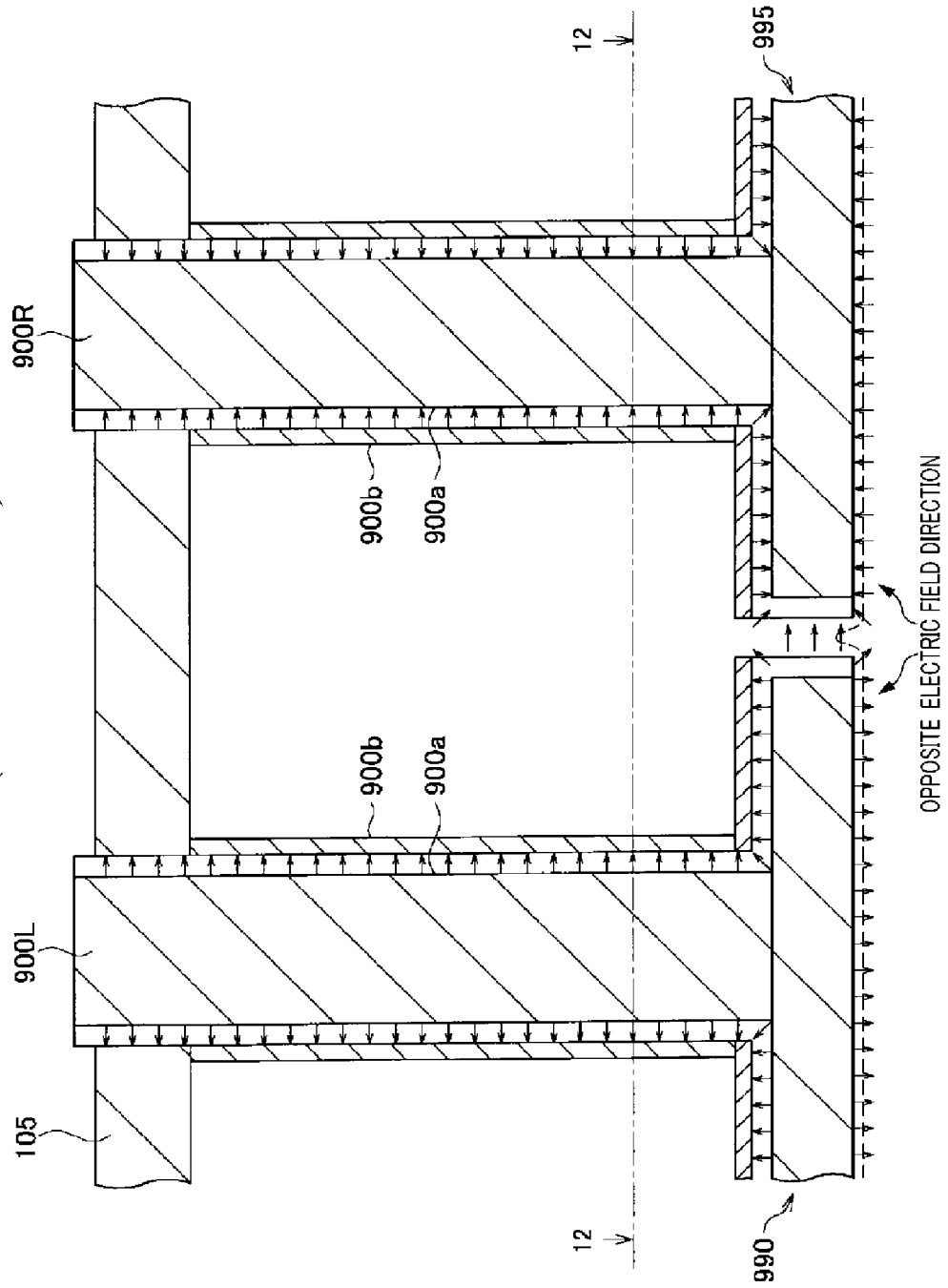

IMPEDANCE VARIABLE CIRCUIT 380a   380b   380c

PLASMA PROCESSING APPARATUS AND PLASMA PROCESSING METHOD

CROSS-REFERENCE TO RELATED APPLICATION

This Application is a U.S. national phase application under 35 U.S.C. §371 of PCT Application No. PCT/JP2011/066077 filed on Jul. 14, 2011, which claims the benefit of Japanese Patent Application No. 2010-160449 filed on Jul. 15, 2010, the entire disclosures of which are incorporated herein by reference.

TECHNICAL FIELD

The present disclosure relates to a plasma processing apparatus and a plasma processing method for performing microprocessing on a target object by plasma.

BACKGROUND ART

In a manufacturing process of a flat panel display, a solar cell, a semiconductor device or the like, plasma is used to form a thin film or to perform an etching. By way of example, plasma is generated by introducing a gas into a vacuum chamber and applying a high frequency power having a band ranging from several MHz to several hundreds of MHz to an electrode provided within the chamber. In order to increase productivity, the size of a glass substrate for a flat panel display or a solar cell is getting larger year by year, and a glass substrate having a size exceeding about 2 meter square has already been used.

In a film forming process such as plasma CVD (Chemical Vapor Deposition), plasma having a higher density is required to increase a film forming rate. Further, plasma having a low electron temperature is also required in order to reduce ion irradiation damage by lowering the energy of ions incident on a surface of a substrate and in order to suppress excessive dissociation of gas molecules. In general, if a plasma excitation frequency is increased, a plasma density may increase whereas an electron temperature decreases. Accordingly, it may be desirable to set the plasma excitation frequency to be high in order to form a high-quality thin film with a high throughput. Thus, a high frequency in a VHF (Very High Frequency) band ranging from about 30 MHz to about 300 MHz, higher than about 13.56 MHz of a typically used high frequency power supply, has been used in a plasma process (see, for example, Patent Documents 1 and 2).

Patent Document 1: Japanese Patent Laid-open Publication No. H09-312268
Patent Document 2: Japanese Patent Laid-open Publication No. 2009-021256

DISCLOSURE OF THE INVENTION

Problems to be Solved by the Invention

If, however, a plasma excitation frequency increases as a substrate size increases, uniformity of plasma density may be deteriorated due to a standing wave of a surface wave generated in an electrode to which a high frequency power is applied. In general, if the size of the electrode to which the high frequency power is applied increases over about 1/20 of a wavelength in a free space, uniform plasma excitation may not be achieved unless any special countermeasure is prepared.

For example, for a substrate having a size of 1 meter square, if a plasma excitation frequency is set to be about 13.56 MHz, uniform plasma may be obtained. However, it may be difficult to form a high-quality thin film at a high throughput because a plasma density is low and an electron temperature is high. Meanwhile, if the plasma excitation frequency is set to be about three times higher to, e.g., about 40 MHz, a film quality and a film forming rate may be improved. However, uniformity of plasma may be greatly deteriorated. Thus, there has been a demand for a technique for exciting uniform plasma on a large substrate having a size exceeding about 2 meter square even with a high frequency equal to or higher than about 40 MHz.

In view of the foregoing problem, illustrative embodiments provide a novel or improved plasma processing apparatus capable of exciting uniform plasma on a substrate even when a plasma excitation frequency is high.

Means for Solving the Problems

In accordance with one aspect of an illustrative embodiment, there is provided a plasma processing apparatus including a decompression chamber that includes therein a mounting table configured to mount a processing target object thereon; and a plasma space in which plasma is generated, the plasma space being formed above the mounting table; a transmission path through which a high frequency power for exciting plasma is supplied into the decompression chamber; a waveguide path, connected to the transmission path, having a slit-shaped opening toward the plasma space; and an adjusting unit configured to adjust a wavelength of a high frequency power propagating in the waveguide path in a lengthwise direction of the slit-shaped opening. Further, both ends of the waveguide path in the lengthwise direction of the slit-shaped opening are not short-circuited.

In this configuration, the waveguide path has a slit-shaped opening toward the plasma space in the lengthwise direction of the slit-shaped opening, and the adjusting unit is configured to adjust the wavelength of the high frequency power propagating in the waveguide path. To elaborate, by adjusting an effective height of the waveguide path, the wavelength of the high frequency power within waveguide become sufficiently lengthened. If the guide wavelength is sufficiently lengthened, a standing wave may not be generated and a uniform electric field may be applied in the lengthwise direction of the slit-shaped opening. Accordingly, even when a plasma excitation frequency is high, uniform plasma can be generated.

The adjusting unit may be configured to adjust the wavelength of the high frequency power propagating in the waveguide path such that the wavelength of the high frequency power propagating in the waveguide path becomes equal to or larger than about seven times the length of the slit-shaped opening in the lengthwise direction thereof.

The transmission path may be a first coaxial waveguide, and the first coaxial waveguide may include an internal conductor electrically connected to one of two wall surfaces constituting the waveguide path; and an external conductor electrically connected to the other one of the two wall surfaces. Here, the internal conductor may face a widthwise direction of the slit-shaped opening.

The plasma processing apparatus may further include a first dielectric plate inserted into the waveguide path and exposed to the plasma space. Further, the internal conductor of the first coaxial waveguide may penetrate through a hole formed in the first dielectric plate.

The plasma processing apparatus may further include at least one second coaxial waveguide including an internal conductor electrically connected to one of two wall surfaces constituting the waveguide path and an external conductor electrically connected to the other one of the two wall surfaces. Further, the internal conductor of the second coaxial waveguide may face a widthwise direction of the slit-shaped opening, and the adjusting unit may be an impedance variable circuit connected to the second coaxial waveguide.

The number of the first coaxial waveguide may be one and the number of the at least one second coaxial waveguide is two, and the first coaxial waveguide may be disposed between the two second coaxial waveguides.

The impedance variable circuit may be one of a circuit including only a variable capacitor, a circuit including a variable capacitor and a coil that are connected in parallel, or a circuit including a variable capacitor and a coil that are connected in series.

The adjusting unit may include a metal member that is configured to short-circuit two wall surfaces constituting the waveguide path and faces a widthwise direction of the slit-shaped opening; and a driving device configured to move the metal member.

The adjusting unit may include a second dielectric plate inserted into the waveguide path; and a driving device configured to move the second dielectric plate.

The plasma processing apparatus may further include a reflectometer connected to the first coaxial waveguide and configured to measure a reflection or an impedance of a high frequency power propagating in the first coaxial waveguide; and a controller configured to adjust a wavelength of the high frequency power propagating in the waveguide path in the lengthwise direction of the slit-shaped opening based on the reflection or the impedance measured by the reflectometer.

The controller may be configured to adjust the wavelength of the high frequency power propagating in the waveguide path to minimize a reflection of the high frequency power from the first coaxial waveguide.

In accordance with another aspect of the illustrative embodiment, there is provided a plasma processing method using a plasma processing apparatus including a decompression chamber that includes therein a mounting table configured to mount a processing target object thereon, and a plasma space in which plasma is generated, the plasma space being formed above the mounting table; a transmission path through which a high frequency power for exciting plasma is supplied into the decompression chamber; a waveguide path, connected to the transmission path, having a slit-shaped opening toward the plasma space; and an adjusting unit configured to adjust a wavelength of a high frequency power propagating in the waveguide path in a lengthwise direction of the slit-shaped opening. The plasma processing method includes measuring a reflection or an impedance of a high frequency power propagating in a first coaxial waveguide by a reflectometer connected to the first coaxial waveguide; and adjusting a wavelength of the high frequency power propagating in the waveguide path in the lengthwise direction of the slit-shaped opening based on the reflection or the impedance measured by the reflectometer.

The plasma processing apparatus may further include a second coaxial waveguide including an internal conductor electrically connected to one of two wall surfaces constituting the waveguide path and an external conductor electrically connected to the other one of the two wall surfaces and the internal conductor faces a widthwise direction of the slit-shaped opening, and, in the adjusting the wavelength of the high frequency power propagating in the waveguide path, the wavelength of the high frequency power propagating in the waveguide path may be adjusted by controlling the impedance variable circuit connected to the second coaxial waveguide.

The plasma processing apparatus may further include a metal member that is configured to short-circuit two wall surfaces constituting the waveguide path and faces a widthwise direction of the slit-shaped opening, and, in the adjusting the wavelength of the high frequency power propagating in the waveguide path, the wavelength of the high frequency power propagating in the waveguide path may be adjusted by moving the metal member.

The plasma processing apparatus may further include a second dielectric plate inserted into the waveguide path, and, in the adjusting the wavelength of the high frequency power propagating in the waveguide path, the wavelength of the high frequency power propagating in the waveguide path may be adjusted by moving the second dielectric plate.

Effect of the Invention

As stated above, in accordance with the illustrative embodiments, plasma can be uniformly generated in a lengthwise direction of a slit-shaped opening by adjusting a wavelength of a high frequency power propagating within a waveguide.

BRIEF DESCRIPTION OF THE DRAWINGS

FIG. 3A is a diagram for describing a high frequency power applied to an electrode in accordance with the first illustrative embodiment.

FIG. 3B is a diagram for describing a high frequency power applied to an electrode having a conventional structure.

BEST MODE FOR CARRYING OUT THE INVENTION

Figure 1:
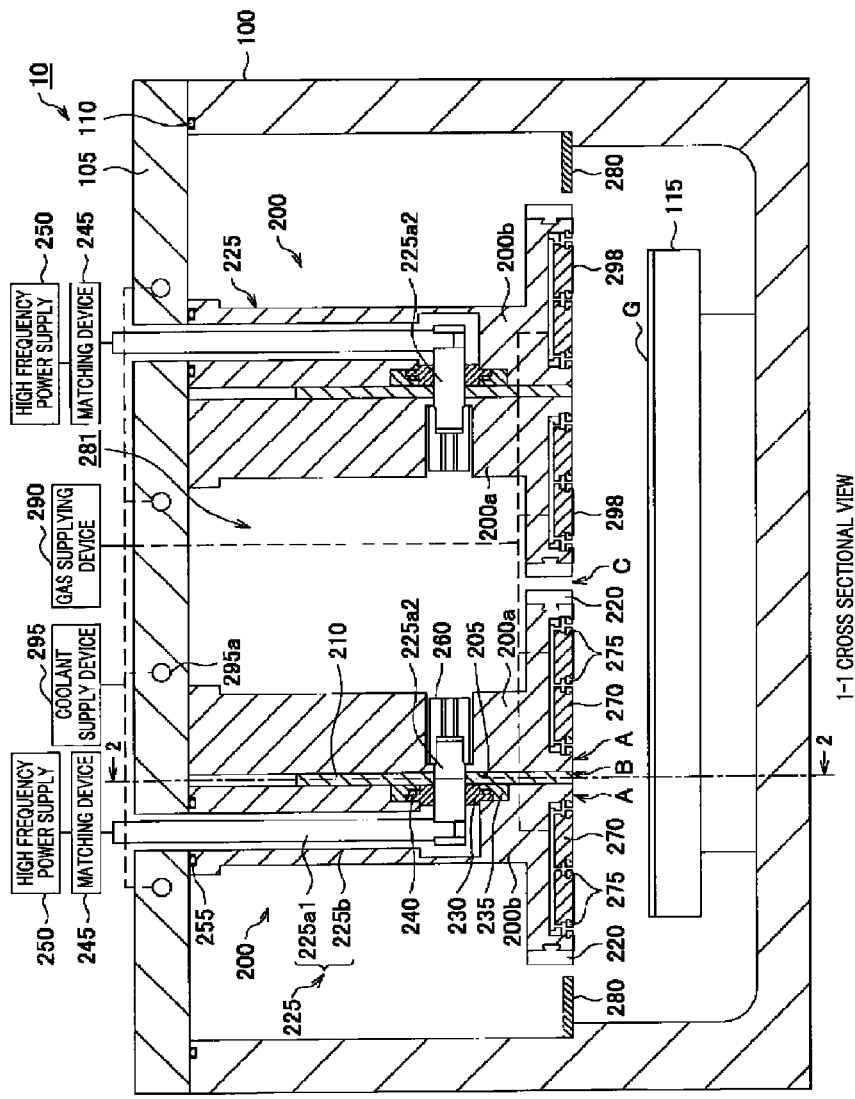
FIG. 1 is a longitudinal cross sectional view (taken along a line 1-1 of FIG. 2) of a plasma processing apparatus in accordance with a first illustrative embodiment.

Hereinafter, illustrative embodiments will be described in detail with reference to the accompanying drawings. In the specification and drawings, parts having substantially the same function and configuration will be assigned like reference numerals, and redundant description will be omitted.

First Illustrative Embodiment

Configuration of Plasma Processing Apparatus

Figure 2:
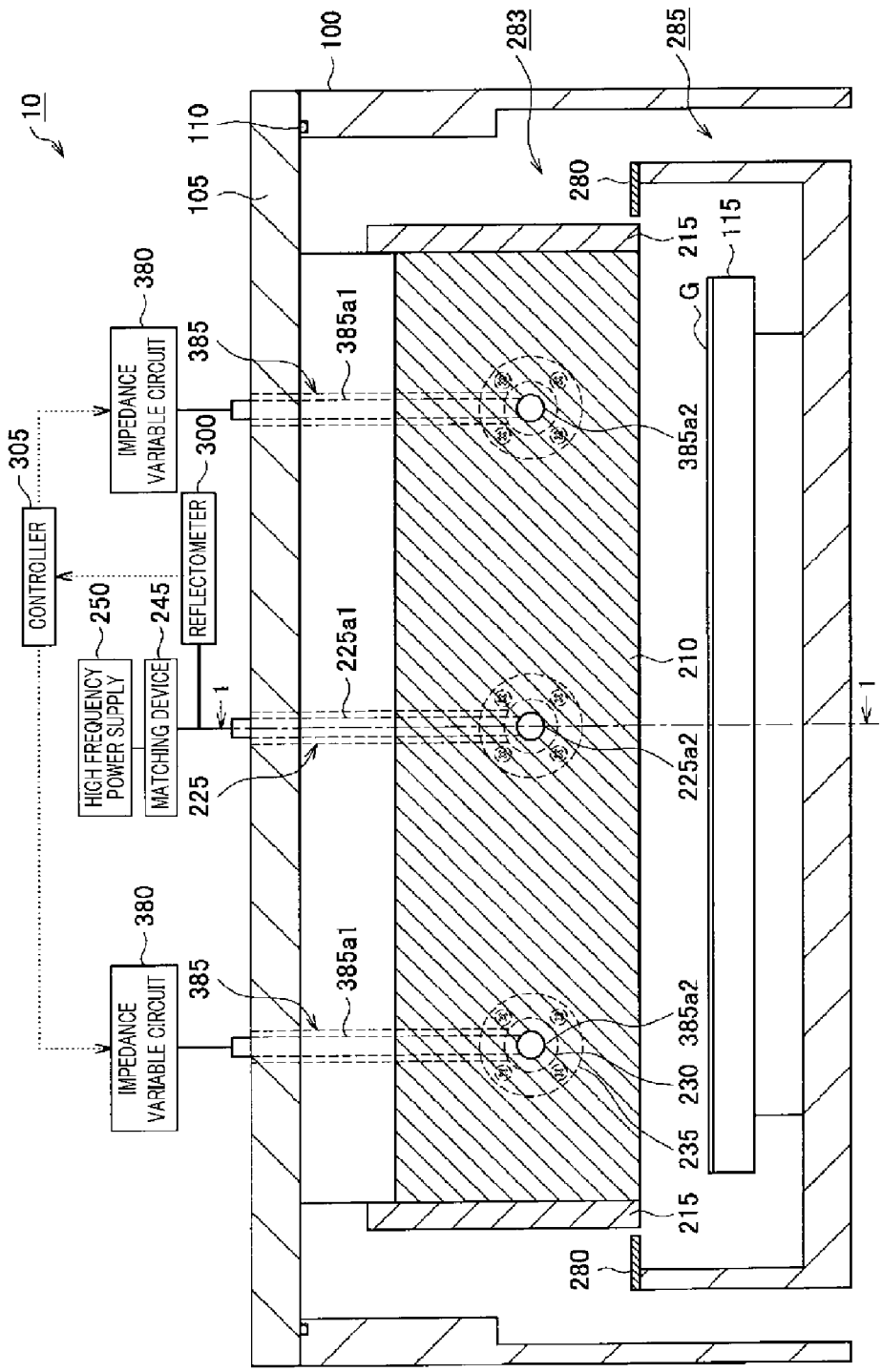
FIG. 2 is a longitudinal cross sectional view (taken along a line 2-2 of FIG. 1) of the plasma processing apparatus in accordance with the first illustrative embodiment.

First, a schematic configuration of a plasma processing apparatus in accordance with a first illustrative embodiment will be described with reference to longitudinal cross sectional views shown in FIGS. 1 and 2. FIG. 1 is a longitudinal cross sectional view taken along a line 1-1 of FIG. 2, and FIG. 2 is a longitudinal cross sectional view taken along a line 2-2 of FIG. 1. A plasma processing apparatus 10 depicted in FIGS. 1 and 2 is an example of an apparatus configured to supply a high frequency current between a multiple number of electrodes and exhaust a gas from directly above a substrate. Below, a configuration of each component of the plasma processing apparatus will be described.

The plasma processing apparatus 10 includes a vacuum chamber 100 for mounting therein a glass substrate G (hereinafter, simply referred to as a "substrate G"). The substrate G is processed by plasma in the vacuum chamber 100. The vacuum chamber 100 has a rectangular cross sectional shape and is made of a metal such as an aluminum alloy. The vacuum chamber 100 is grounded. An open top of the vacuum chamber 100 is covered by a lid 105, and an inside of the vacuum chamber 100 is hermetically sealed by an O-ring 110.

The substrate G is mounted on a mounting table 115. The substrate G is an example of a processing target object, and the processing target object may be a silicon wafer.

Two electrode pairs 200 are arranged on a surface (ceiling surface) of the vacuum chamber 100 facing a surface at a side of the substrate. Each electrode pair 200 includes a first electrode member 200a and a second electrode member 200b that are made of an aluminum alloy and have the same size. The electrode members 200a and 200b are arranged in a left-right direction with a gap therebetween. The electrode members 200a and 200b are fastened to the lid 105 by screws (not shown).

The first electrode member 200a and the second electrode member 200b are elongated from the vicinity of a plasma space in a direction away from the mounting table 115. The gap between the first electrode member 200a and the second electrode member 200b serves as a waveguide path 205 opened in a slit shape toward the plasma space. A dielectric plate 210 is inserted in the waveguide path 205. The dielectric plate 210 is made of a dielectric material such as alumina or quartz. Since an upper portion of the waveguide path 205 is short-circuited, electric field intensity in the upper portion of the waveguide path 205 is lower than electric field intensity in the lower portion thereof. Accordingly, if the dielectric plate 210 is inserted into the lower portion of the waveguide path 205 having the higher electric field intensity, the upper portion of the waveguide path 205 may be formed as a cavity. However, it may be also possible that the dielectric plate 210 is inserted into the upper portion of the waveguide path 205 as well as the lower portion thereof. In the following description, an opening in a bottom surface of the waveguide path 205 clogged with the dielectric plate 210 will be referred to as a "dielectric slit". The areas of surfaces A (hereinafter, referred to as "plasma exposure surfaces") of the left and right electrode members 200a and 200b to be exposed to plasma are substantially the same. Accordingly, electric field intensities on bottom surfaces of the electrode members 200a and 200b become substantially the same, so that the distribution of electric field intensity on a bottom surface of the electrode pair 200 can be uniformed.

Further, in the present specification, a widthwise direction of the slit-shaped opening (dielectric slit) of the waveguide path 205 coincides with a transversal direction of FIG. 1 (i.e., a direction orthogonal to a paper plane of FIG. 2); a lengthwise direction of the slit-shaped opening (dielectric slit) coincides with a transversal direction of FIG. 2 (i.e., a direction orthogonal to a paper plane of FIG. 1); and a normal direction of the slit-shaped opening (dielectric opening) coincides with a longitudinal direction of FIG. 1.

An external conductor 225b of a coaxial waveguide 225 is formed as one body with the second electrode member 200b. An end portion of an internal conductor 225a1 of the coaxial waveguide 225 is perpendicularly fastened to an internal conductor 225a2 of the coaxial waveguide 225 by a screw. The internal conductor 225a2 is connected to the first electrode member 200a through a hole formed in the dielectric plate 210.

That is, the internal conductors 225a1 and 225a2 of the coaxial waveguide 225 are connected to one electrode member of the electrode pair 200, whereas the external conductor 225b of the coaxial waveguide 225 is connected to the other electrode member of the electrode pair 200. A high frequency power supply 250 is connected to a top end of the coaxial waveguide 225 via a matching device 245. A high frequency power outputted from the high frequency power supply 250 propagates through the waveguide path 205 between the two electrode members 200a and 200b via the coaxial waveguide 225 in a direction perpendicular to the paper plane. Then, the high frequency power is emitted to the inside of the vacuum chamber 100 through the dielectric slit. Then, the high frequency power propagates in the bottom surfaces (plasma exposure surfaces A) of the electrode members 200a and 200b as surface waves and is consumed to excite plasma. Here, high frequency powers having the same amplitude and reverse phases are applied to sheaths on the bottom surfaces of the first and second electrode members 200a and 200b.

The internal conductor 225a2 is penetrated through an insulating ring 230 to be soldered. The internal conductor 225a2 is fastened to the first electrode member 200a by an insulating ring holder 235 with the insulating ring 230 therebetween. An O-ring 240 is provided between the insulating ring 230 and the insulating ring holder 230 to isolate a vacuum and an atmosphere. In the present illustrative embodiment, an inside of the coaxial waveguide 225 is under the atmosphere. Accordingly, in order to hermetically seal the inside of the vacuum chamber, a joint surface between the lid 105 and the external conductor 225b is hermetically sealed by an O-ring 255. A leading end of the internal conductor 225a2 has a screw structure. By screwing a box nut 260, the leading end of the internal conductor 225a2 is covered with the box nut 260.

As stated above, the internal conductor 225a2 penetrates the dielectric plate 210 between the plasma exposure surfaces of each electrode pair 200 and the ceiling surface (i.e., the surface facing the substrate G) of the vacuum chamber 100. Internal conductors 225a2 provided in the adjacent electrode pairs 200 penetrate dielectric plates 210 of the electrode pairs 200 in opposite directions. With this configuration, when high frequency powers having the same amplitude and the same phase are supplied to the left and right coaxial waveguides 225, high frequency powers having the same amplitude and reverse phases are applied to the left and right electrode pairs, respectively. Further, in the present specification, the term "high frequency" refers to a frequency band ranging from about 10 MHz to about 3000 MHz, and it is an example of an electromagnetic wave. Further, the coaxial waveguide 225 is an example transmission path for supplying a high frequency power. Instead of the coaxial waveguide 225, a coaxial cable or a rectangular waveguide may be used.

The plasma exposure surfaces A of the two electrode members 200a and 200b of the electrode pair 200 are rectangular. The dielectric plate 210 is disposed to be substantially perpendicular to the plasma exposure surfaces A of the electrode members 200a and 200b. On each of the plasma exposure surfaces A of the electrode members 200a and 200b, a length in a direction (transversal direction of FIG. 1) perpendicular to the waveguide path 205 and parallel to the mounting table 115 is shorter than a length in a direction (direction perpendicular to the paper plane of FIG. 1) parallel to the waveguide path 205 and parallel to the mounting table 115.

As illustrated in FIG. 2, in accordance with the present illustrative embodiment, impedance variable circuits 380 are provided in order to excite uniform plasma regardless of plasma excitation conditions. Besides the coaxial waveguide 225 provided at a center portion in a lengthwise direction of the electrode to supply a high frequency power, two coaxial waveguides 385 respectively connected to two impedance variable circuits 380 are additionally provided in the vicinity of both ends of the electrode in the lengthwise direction of the electrode. The configurations of an internal conductor and an external conductor of each coaxial waveguide 385 are the same as those of the coaxial waveguide 225.

Figure 14:
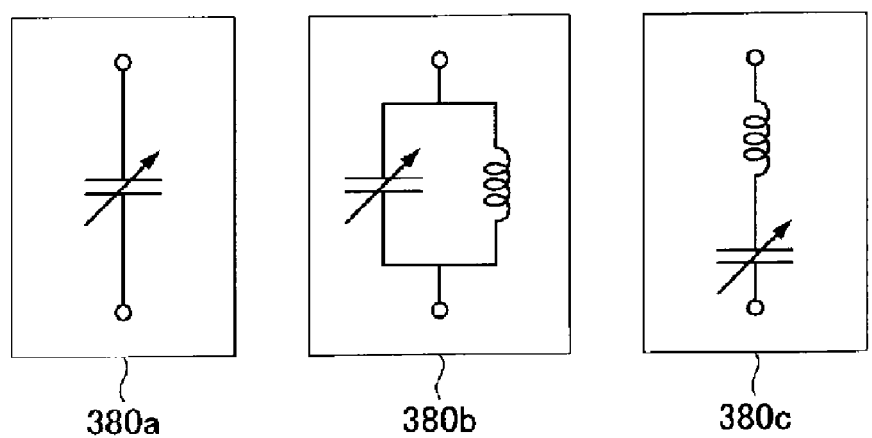
FIG. 14 is a diagram showing an example impedance variable circuit in accordance with the fourth illustrative embodiment.

Configuration examples of the impedance variable circuit 380 are illustrated in FIG. 14. By way of examples, a structure 380a only including a variable capacitor, a structure 380b including a variable capacitor and a coil which are connected in parallel, a structure 380c including a variable capacitor and a coil which are connected in series, or the like may be used.

As will be discussed in detail in the description of a second illustrative embodiment, an effective height of the waveguide path 205 can be adjusted by a reactance of the impedance variable circuit 380. If the effective height is set such that the waveguide path 205 is accurately cut off, a wavelength of a high frequency power propagating in the waveguide path 205 in the lengthwise direction of the dielectric slit may become sufficiently lengthened. Accordingly, a uniform electric field may be applied to the entire dielectric slit. In this way, by using a cut-off state of the waveguide, uniform plasma can be excited on a long electrode surface.

It may be possible to set a reflection viewed from the coaxial waveguide 225 to be minimized when the waveguide path comes into a cut-off state accurately. To elaborate, the effective height of the waveguide path may be adjusted to minimize the reflection viewed from the coaxial waveguide 225. Further, since a plasma state or the like may vary from moment to moment in a process, it may be desirable to adjust the effective height of the waveguide path even during the process. Accordingly, in accordance with the present illustrative embodiment, a reflectometer 300 is provided between the matching device 245 and the coaxial waveguide 225 to monitor the state of the reflection viewed from the coaxial waveguide 225. A detection value from the reflectometer 300 is inputted to a controller 305. The controller 305 outputs an instruction to adjust the impedance variable circuit 380 based on the received detection value. In this way, by adjusting the effective height of the waveguide path, the reflection viewed from the coaxial waveguide 225 may be minimized. Further, since a reflection coefficient can be adjusted to be a very small value through the above control, the matching device 245 may not be provided.

In order to prevent occurrence of an electric discharge on lower lateral surfaces of the electrode members 200a and 200b as well as introduction of plasma into upper portions of the electrode members 200a and 200b, the lower lateral surfaces of the electrode members 200a and 200b in a widthwise direction of the dielectric slit are covered with first dielectric covers 220 (see FIG. 1). By fitting protrusions formed on the first dielectric covers 220 into recesses formed on the lateral surfaces of the electrode members 200a and 200b, the first dielectric covers 220 are fastened.

In order to apply a uniform high frequency electric field up to an end portion of a dielectric slit in the lengthwise direction of the dielectric slit in the widthwise direction of the dielectric slit, an end surface of the waveguide path 205 in the lengthwise direction of the dielectric slit needs to be open. Accordingly, lower lateral surfaces of the electrode members 200a and 200b in the lengthwise direction of the dielectric slit are covered with second dielectric covers 215 in order to allow the end surface of the waveguide path 205 in the lengthwise direction of the dielectric slit to be opened and in order to prevent an electric discharge on both lateral surfaces of the electrode members (see FIG. 2). The second dielectric covers 215 are fastened to the electrode members 200a and 200b by insulating screws (not shown). A part of the bottom surface of the electrode pair 200 is covered with an insulating film 298. A function and an effect of the insulating film 298 will be described later.

In accordance with the present illustrative embodiment, the plasma exposure surfaces A of the electrode members 200a and 200b are formed to have a vertical position equal to a plasma exposure surface B of the dielectric plate 210. However, the plasma exposure surface B of the dielectric plate 210 may have a vertical position higher than or lower than the plasma exposure surfaces A of the electrode members 200a and 200b.

Each electrode pair 200 is configured as a shower plate. To elaborate, a recess is formed in a bottom portion of each of the electrode members 200a and 200b, and electrode covers 270 for shower plate are inserted in these recesses, respectively. The electrode covers 270 are fastened to the electrode members 200a and 200b by screws (not shown). A gap is formed between the electrode members 200a and 200b and the electrode cover 270, and this gap serves as a gas flow path. Gas nozzles 275 made of an insulating material, such as alumina, are inserted in a lower end of the gas flow path. Each gas nozzle 275 has a long and narrow shape in a direction perpendicular to the paper plane and is provided with a multiple number of gas discharge holes. A gas that has passed through the gas flow path is discharged into the vacuum chamber through the gas discharge holes formed at the gas nozzles 275. With this configuration, by providing the gas nozzles 275, the screws for fastening the electrode cover 270 can be prevented from coming into contact with the plasma. Further, since the gas nozzles 275 are made of the insulating material, a high frequency electric field applied to an inside of the gas discharge holes can be reduced. Accordingly, an electric discharge within the gas discharge holes can be prevented.

A side cover 280 is provided at a step-shaped portion of a sidewall of the vacuum chamber 100 in the vicinity of the lower ends of the electrode pairs 200. The side cover 280 is made of aluminum or an insulating material such as alumina. The side cover 280 prevents plasma from entering a second gas exhaust path 283.

In order to perform a uniform process, it may not be sufficient to obtain uniform plasma. Since various other conditions such as a gas pressure, a density of a source gas, a density of a reaction product gas, a gas staying time, a substrate temperature and the like also affect the process, these conditions also need to be uniformed on the substrate. In a typical plasma processing apparatus, a shower plate is provided at a portion facing a substrate G, and a gas is supplied toward the substrate G. The gas is flown from a central portion of the substrate G toward a periphery portion thereof, and then, is exhausted from the periphery portion of the substrate. Thus, inevitably, a gas pressure at the central portion of the substrate tends to be higher than a gas pressure at the periphery portion thereof, and a gas staying time at the periphery portion of the substrate tends to be longer than the gas staying time at the central portion thereof. If the size of the substrate increases, it may become difficult to perform a uniform process since uniformity of the gas pressure and the gas staying time is deteriorated. Thus, in order to perform a uniform process even on a large-size substrate, the gas needs to be supplied and exhausted from directly above the substrate.

In the plasma processing apparatus 10 in accordance with the present illustrative embodiment, a gap for gas exhaust (hereinafter, referred to as a "gas exhaust slit C") is formed between the adjacent electrode pairs 200. That is, a gas from a gas supplying device 290 is supplied into a processing chamber from the bottom surfaces of the electrode pairs 200 through the gas flow paths of the electrode pairs 200, and then, is exhausted upward through the gas exhaust slit C formed directly above the substrate G. After passing through the gas exhaust slit C, the gas is flown in the lengthwise direction of the dielectric slit within a first gas exhaust path 281. Here, the first gas exhaust path 281 is formed above the gas exhaust slit C by the adjacent electrode pairs 200. Then, the gas is introduced into the second gas exhaust path 283 formed between the second dielectric covers 215 and the vacuum chamber 100. Then, the gas is flown downward in a third gas exhaust path 285 formed in the sidewall of the vacuum chamber 100, and then, is exhausted by a vacuum pump (not shown) provided at a lower portion of the third gas exhaust path 285.

A coolant path 295a is formed in the lid 105. A coolant supplied from a coolant supply device 295 is circulated through the coolant path 295a, so that heat from the plasma is transferred to the lid 105 via the electrode pairs 200.

(High Frequency Current)

As described in Patent Document 1, in a conventional plasma CVD apparatus, a high frequency power applying electrode having the same size as that of a substrate electrode that mounts a substrate thereon is provided at a position facing the substrate electrode. By applying a high frequency power between the substrate electrode and the high frequency power applying electrode, plasma is excited. A high frequency current flows between the substrate electrode and the high frequency power applying electrode via the plasma. In this configuration, in a high frequency band equal or higher the VHF band, it may be not possible to excite uniform plasma on a large-size substrate due to a standing wave. Further, since a high frequency current having a high magnitude is introduced into the substrate, a self-bias electric potential may be generated in a surface of the substrate so that ions may reach the substrate while being accelerated. Thus, due to a damage caused by ion irradiation at this time, a high-quality process may not be performed.

Accordingly, it may be considered to split the high frequency power applying electrode and apply a high frequency power between individual electrodes. It is deemed that if the high frequency power applying electrode is split and a size of a single individual electrode is set to be smaller than a wavelength of a surface wave, uniform plasma may be excited. Further, in such a case, since a high frequency current does not flow in the substrate, a damage caused by the ion irradiation can be avoided.

An example of a plasma processing apparatus configured to excite plasma by splitting electrode and applying high frequency powers having different phases is illustrated in FIG. 3B. FIG. 3A is a diagram schematically illustrating a high frequency power applied to the electrode pairs 200 in accordance with the first illustrative embodiment. In this figure, arrows indicate directions of high frequency electric fields. A power supply shown in FIG. 3B is distinguished from the power supply illustrated in FIG. 3A. Here, for the convenience of explanation, the power supply illustrated in FIG. 3A will be referred to as "power supply from inside of electrode," while the power supply illustrated in FIG. 3B will be referred to as "power supply from outside of electrode."

(Power Supply from Outside of Electrode)

As depicted in FIG. 3B, when viewed from a substrate G, a multiple number of rectangular electrodes are arranged in a transversal direction. High frequency powers having the same amplitude and reverse phases are applied to adjacent electrodes. The high frequency powers are supplied from coaxial waveguides 900L and 900R connected to top surfaces of electrodes 990 and 995, respectively. Each of the coaxial waveguides 900L and 900R includes an internal conductor 900a and an external conductor 900b.

The high frequency power supplied from the coaxial waveguides 900L and 900R and having the reverse phases are combined one time in a gap between the electrodes 990 and 995 after propagating on top surfaces of the electrodes 990 and 995. Then, the high frequency powers are slit again and propagated on bottom surfaces of the electrodes 990 and 995. High frequency electric fields of opposite directions are applied to sheaths on the bottom surfaces of the electrodes 990 and 995. High frequency currents flow between the electrodes via plasma.

Figure 4A:
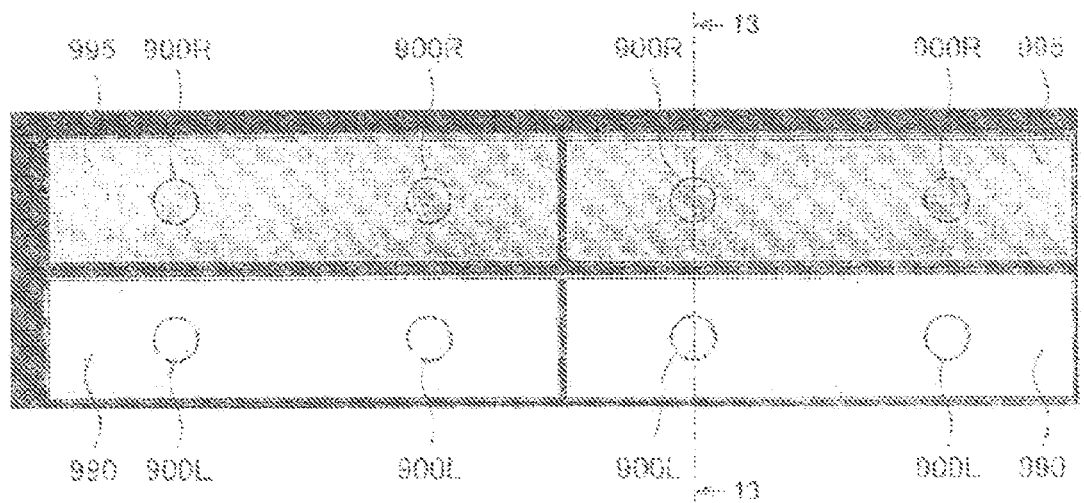
FIG. 4A is a diagram showing a distribution of high frequency electric field intensity in sheaths on bottom surfaces of electrodes having the conventional structure (when a high frequency power is supplied from all coaxial waveguides).
Figure 4B:
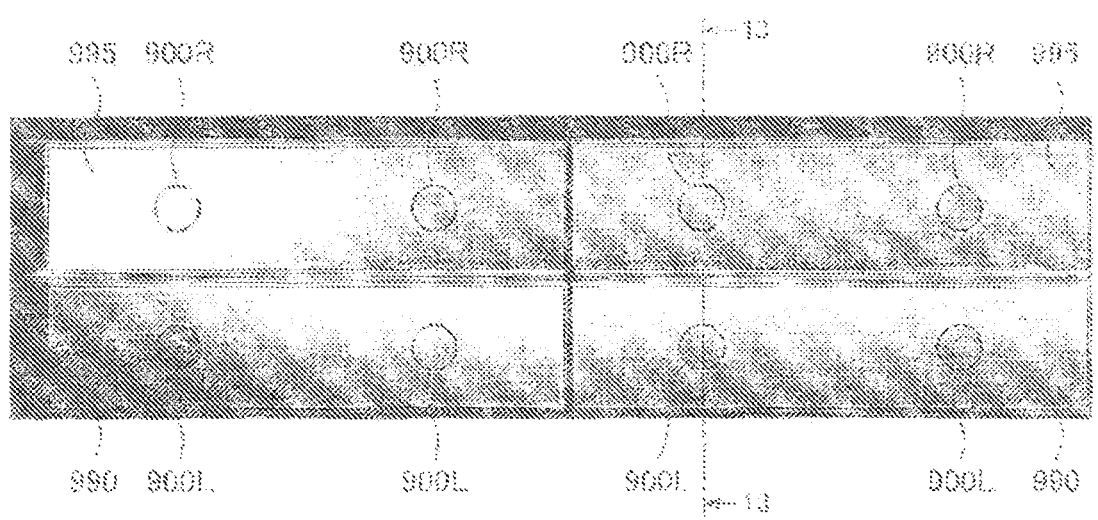
FIG. 4B is a diagram showing a distribution of high frequency electric field intensity in sheaths on the bottom surfaces of the electrodes having the conventional structure (when a high frequency power is supplied only from upper coaxial waveguides).

FIGS. 4A and 4B are perspective views taken along a line 12-12 of FIG. 3B. FIG. 3B is a cross sectional view taken along a line 13-13 of FIG. 4A. In FIGS. 4A and 4B, high frequency electric field intensities in sheaths between electrodes and plasma calculated by simulation are indicated by shading. A white portion indicates a place where an electric field is strong and a block portion indicates a place where an electric field is weak. Simulation was conducted for a sample in which 4×4 (16) of rectangular prism-shaped electrodes are arranged in column-wise and row-wise. Among these, 2×2 (4) of electrodes on the upper left part are only illustrated. Two coaxial waveguides 900L and 900R are connected to each of electrodes 990 and 995. FIG. 4A illustrates a case where high frequency powers having the same amplitude and reverse phases are supplied from upper eight coaxial waveguides 900R and lower eight coaxial waveguides 900L, respectively. FIG. 4B illustrates a case where the high frequency powers are supplied only from the upper eight coaxial waveguides 900R.

As depicted in FIG. 4A, even when the high frequency powers having the same amplitude are applied to the upper and lower electrodes from the coaxial waveguides connected thereto, electric field intensities of the upper electrodes 995 is weaker than those of the lower electrodes 990. Further, as shown in FIG. 4B, even when high frequency powers are not applied to the coaxial waveguides 900L connected to the lower electrodes, electric field intensities of the lower electrodes 990 are found to be partially stronger than those of the upper electrodes 995.

As can be viewed from the above, unless plasma excitation intensity can be controlled for the respective electrodes individually, it may not be possible to generate uniform plasma on a large-size substrate. For example, as shown in FIG. 4A, since the electric field intensities of the electrodes in a row (upper portion) is weak, if a high frequency power supplied from the coaxial waveguides connected to these electrodes is increased, the electric field intensities of the electrodes in a row (lower portion) below the upper end row may be strengthened. As a result, plasma uniformity may be further deteriorated.

Since the high frequency powers supplied from the coaxial waveguides 900L and 900R are once combined and then propagated between the electrodes 900 and 995 and the plasma after split again, it is difficult to control plasma excitation intensity for the respective electrodes individually. In this configuration, a high frequency power applied to a coaxial waveguide connected to a certain electrode may also reach an adjacent electrode. Further, since a surface wave propagates up to an electrode spaced apart from the certain electrode through a gap therebetween, an unintended standing wave of the surface wave may be generated so that plasma uniformity is deteriorated. Furthermore, since a high frequency electric field is applied to the gap between the electrodes, which is a part of the gas exhaust path, unintended plasma may be generated at this gap. As stated above, the "power supply from outside of electrode" accompanies the several problems.

(Power Supply from Inside of Electrode)

FIG. 3A illustrates a configuration in which an electrode is split in two parts in a transversal direction, and a high frequency power is emitted from a gap therebetween. That is, a first electrode member 200a and a second electrode member 200b forms an electrode pair 200, and a dielectric slit through which a high frequency power is emitted is formed between these electrode members. Considering the electrode pair as a single electrode, the high frequency power is deemed to be supplied from the inside of the electrode. The high frequency power emitted from the dielectric slit is propagated in left-right directions in surfaces of the electrodes as a surface wave. High frequency electric fields of opposite directions are applied to sheaths on bottom surfaces of the first and second electrode members 200a and 200b. Since impedance between adjacent electrode pairs 200 is high, the surface wave propagated to the edges of the electrode members cannot be propagated to an electrode member of the adjacent electrode pair, but may be reflected and returned back. Thus, plasma excitation intensity can be controlled for the respective electrode pairs individually, so that highly uniform plasma can be excited.

Figure 5A:
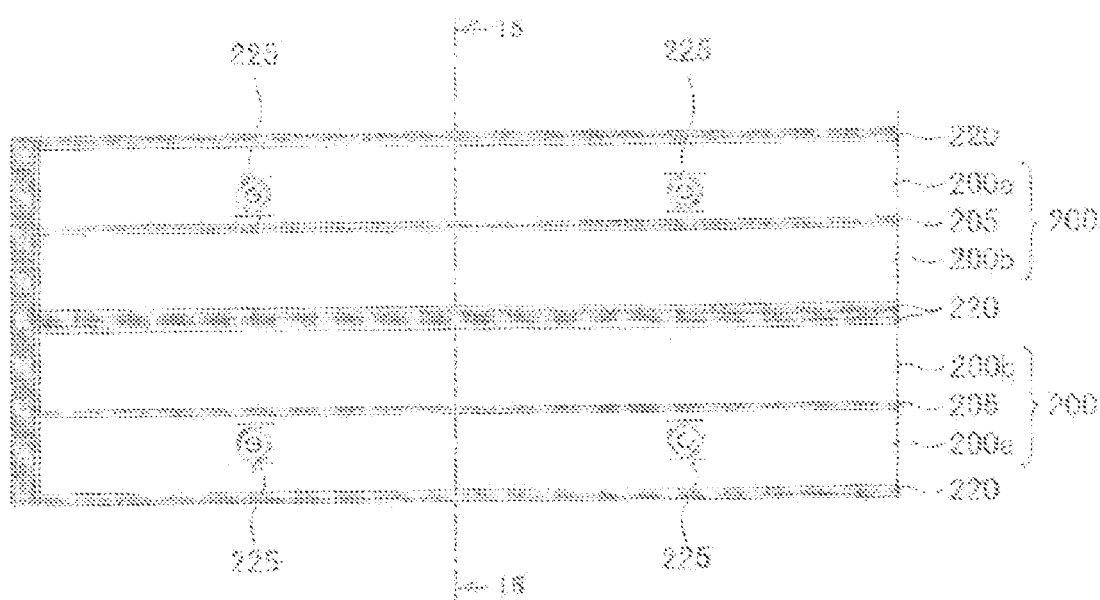
FIG. 5A is a diagram showing a distribution of high frequency electric field intensity in sheaths on bottom surfaces of electrodes in accordance with the first illustrative embodiment (when a high frequency power is supplied from all coaxial waveguides).
Figure 5B:
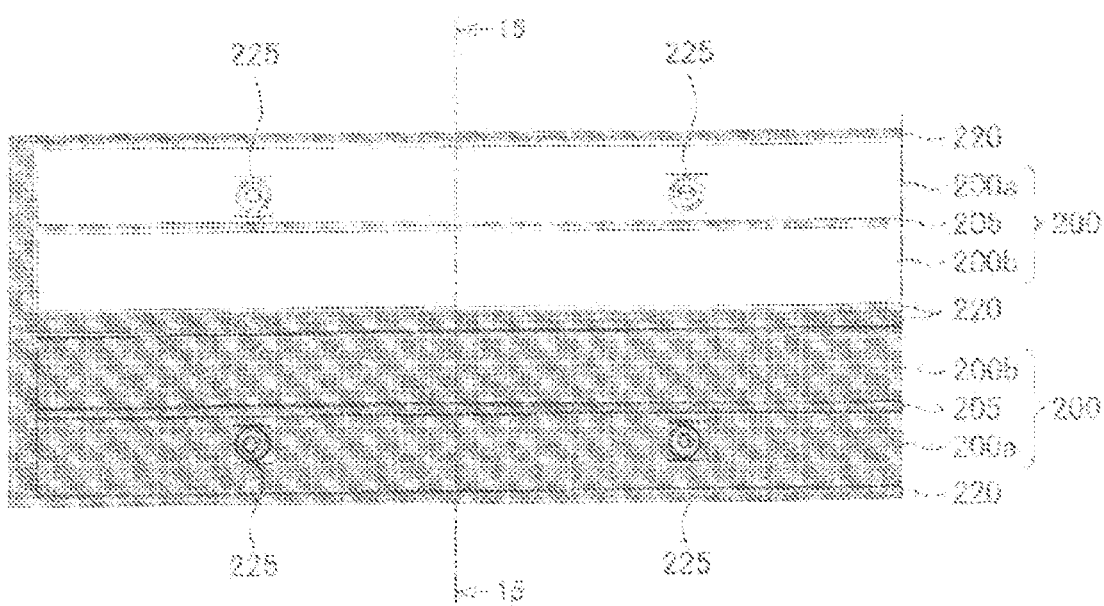
FIG. 5B is a diagram for describing a distribution of high frequency electric field intensity in sheaths on the bottom surfaces of the electrodes in accordance with the first illustrative embodiment (when a high frequency power is supplied only from upper coaxial waveguides).

FIGS. 5A and 5B are perspective views taken along a line 14-14 of FIG. 3A. FIG. 3A is a cross sectional view taken along a line 15-15 of FIG. 5A. In FIGS. 5A and 5B, high frequency electric field intensities in sheaths between the electrodes and plasma calculated by simulation are indicated by shading. Simulation was conducted for a sample in which four electrode pairs 200 are arranged in column-wise. Among these, only the left upper part thereof is illustrated. Four coaxial waveguides 225 are connected to each electrode pair 200. FIG. 5A illustrates a case where high frequency powers having the same amplitude and reverse phases are supplied from all of the coaxial waveguides 225, and FIG. 5B illustrates a case where the high frequency powers are supplied only from upper coaxial waveguides 225.

As depicted in FIG. 5B, if the high frequency powers are applied only from the coaxial waveguide 225 connected to the upper electrode pair 200, an electric field intensity of only the upper electrode pair 200 is increased. This result indicates that plasma excitation intensity can be controlled individually for the respective electrodes. As shown in FIG. 5A, it is proved that uniform plasma can be exited from a central electrode pair to an electrode pair 200 in a row (upper portion) at an end portion thereof.

If high frequency powers having reverse phases are supplied to the adjacent electrode pairs, high frequency powers having the same phase are applied to two adjacent electrode members belonging to different electrode pairs 200, as shown in FIG. 3A. In this state, since a high frequency electric field is not applied to the gap (gas exhaust slit c) between the electrode pairs 200, plasma may not be generated at this portion.

That is, in order to prevent an electric field from being generated at the gas exhaust slit C, the phases of the high frequency powers propagating in the respective waveguide paths 205 of the adjacent electrode pairs 200 need to be deviated from each other by about 180 degrees, so that high frequency electric fields are applied in opposite directions.

For this purpose, in accordance with the present illustrative embodiment, an internal conductor 225a2 of the coaxial waveguide provided in the left electrode pair 200 is disposed in the opposite direction to an internal conductor 225a2 of the coaxial waveguide provided in the right electrode pair 200. With this configuration, the high frequency powers supplied from the high frequency power supply 250 and having the same phase may have reverse phases when they are transmitted to the waveguide 205 via coaxial waveguides.

Further, if the internal conductors 225a2 are arranged in the same direction, by applying high frequency powers having reverse phases to the adjacent electrode pairs from the high frequency power supply 250, high frequency electric fields can be applied to the bottom surfaces of the electrode pairs 200 in the same direction. Accordingly, intensity of the high frequency electric field in the gas exhaust slit C can be made zero.

In a conventional plasma processing apparatus, as shown in FIG. 3B, a top surface of an electrode or an internal conductor of a coaxial waveguide needs to be covered with an insulator and a shield. With this configuration, plasma may not be generated at this portion and a high frequency power may be transmitted without being reflected on this portion. However, it may be difficult to cover the large-size electrode or the internal conductor of the coaxial waveguide with the insulator or shield without a gap. Moreover, a cost of the apparatus would be increased.

Since heat is introduced on a bottom surface of the electrode from plasma, a coolant path is formed in the electrode. By flowing a coolant in the coolant path, heat is transferred. Since a high frequency power is applied to the electrode, a pipeline for supplying the coolant into the electrode needs to be insulated from GND. Furthermore, a multiple number of gas discharge holes are formed in the bottom surface of the electrode to discharge a gas. A pipeline for supplying the gas into the electrode also needs to be insulated from GND. In this way, since all the pipelines connected to the electrode need to be insulated from GND, the structure of the apparatus may be complicated.

Meanwhile, in accordance with the present illustrative embodiment, the electrode members 200a and 200b are short-circuited at their top surfaces and are grounded. The waveguide path 205 may be considered as a waveguide of which lateral side is surrounded by the first and second electrode members 200a and 200b; of which top surface is surrounded by the lid 105; and of which bottom surface is surrounded by plasma. Although a high frequency electric field exists within the waveguide, no high frequency electric field exists outside the waveguide. That is, a high frequency electric field exists in the waveguide path 205 and on bottom surfaces of the electrode pair 200, but does not exists on lateral surfaces of the electrode pair 200 or the like. Accordingly, since the electrodes need not be covered with an insulator or a shield, the structure of the apparatus may be very simplified.

Since the electrode members 200a and 200b are grounded, pipelines such as a pipeline for supplying a gas connected to the electrodes need not be insulated from GND and can be directly connected to a metal pipeline. Furthermore, if heat from plasma is allowed to be transferred to the lid 105 via the electrodes, it may become unnecessary to form a coolant path in the electrode pairs. Accordingly, the configuration of the apparatus can be very simplified.

Since a VHF (Very High Frequency) has a higher band than a high frequency of a high frequency power supply typically used in a plasma processing apparatus, a wavelength thereof becomes shorter. In this state, although the first and second electrode members 200a and 200b are short-circuited at their top portions and connected to GND, a high frequency electric field can be applied to a lower portion of the waveguide path and impedance of the gas exhaust slit of the lower portions of the electrodes can be increased by adjusting the length of the electrodes in height direction thereof (longitudinal direction of the apparatus). With this configuration, the adjacent electrode pairs 200 can be electrically separated, and electric field intensities on plasma exposure surfaces of the respective electrode pairs 200 can be independently controlled.

As discussed above, in the plasma processing apparatus 10 in accordance with the first illustrative embodiment, not a single large-sized electrode having the same size as that of a substrate electrode but a multiple number of smaller electrodes having limited small sizes are located at a position facing a substrate. Further, high frequency powers are applied between the electrodes. Here, the high frequency powers are not supplied from the outside of the electrode but supplied from the inside (dielectric slit) of the electrode (pair). Accordingly, uniform plasma can be generated on a large-size substrate in such a high frequency band as the VHF band. Further, by forming the waveguide and grounding the top portions of the electrodes, the electrodes or the pipelines connected to the electrodes need not be insulated. Thus, the configuration of the apparatus can be simplified. Moreover, by adjusting the effective height of the waveguide path by controlling reactance of the impedance variable circuits, a wavelength of a high frequency power within the waveguide path is set to be sufficiently lengthened. Thus, very uniform plasma can be excited in the lengthwise direction of the electrode even with a high frequency in a high frequency band such as the VHF band.

Second Illustrative Embodiment

Configuration of Plasma Processing Apparatus

Figure 6:
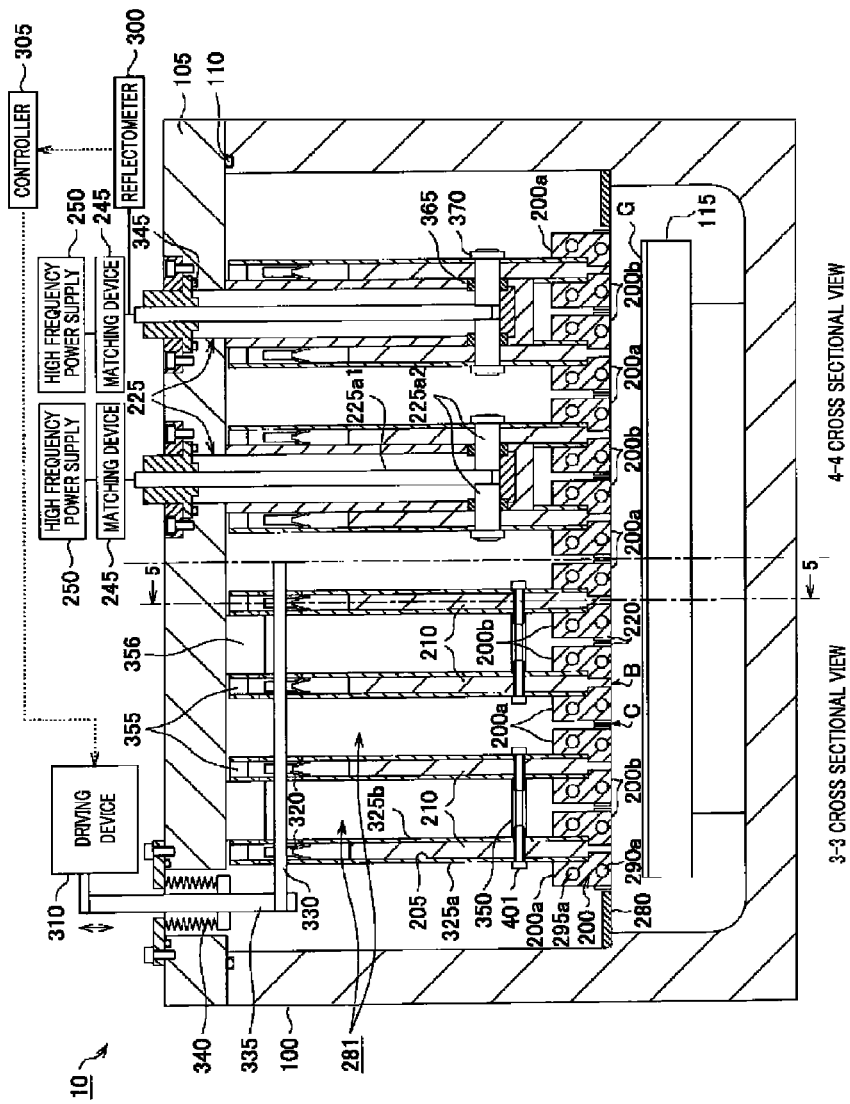
FIG. 6 is a longitudinal cross sectional view (taken along lines 3-3 and 4-4 of FIG. 7) of a plasma processing apparatus in accordance with a second illustrative embodiment.
Figure 7:
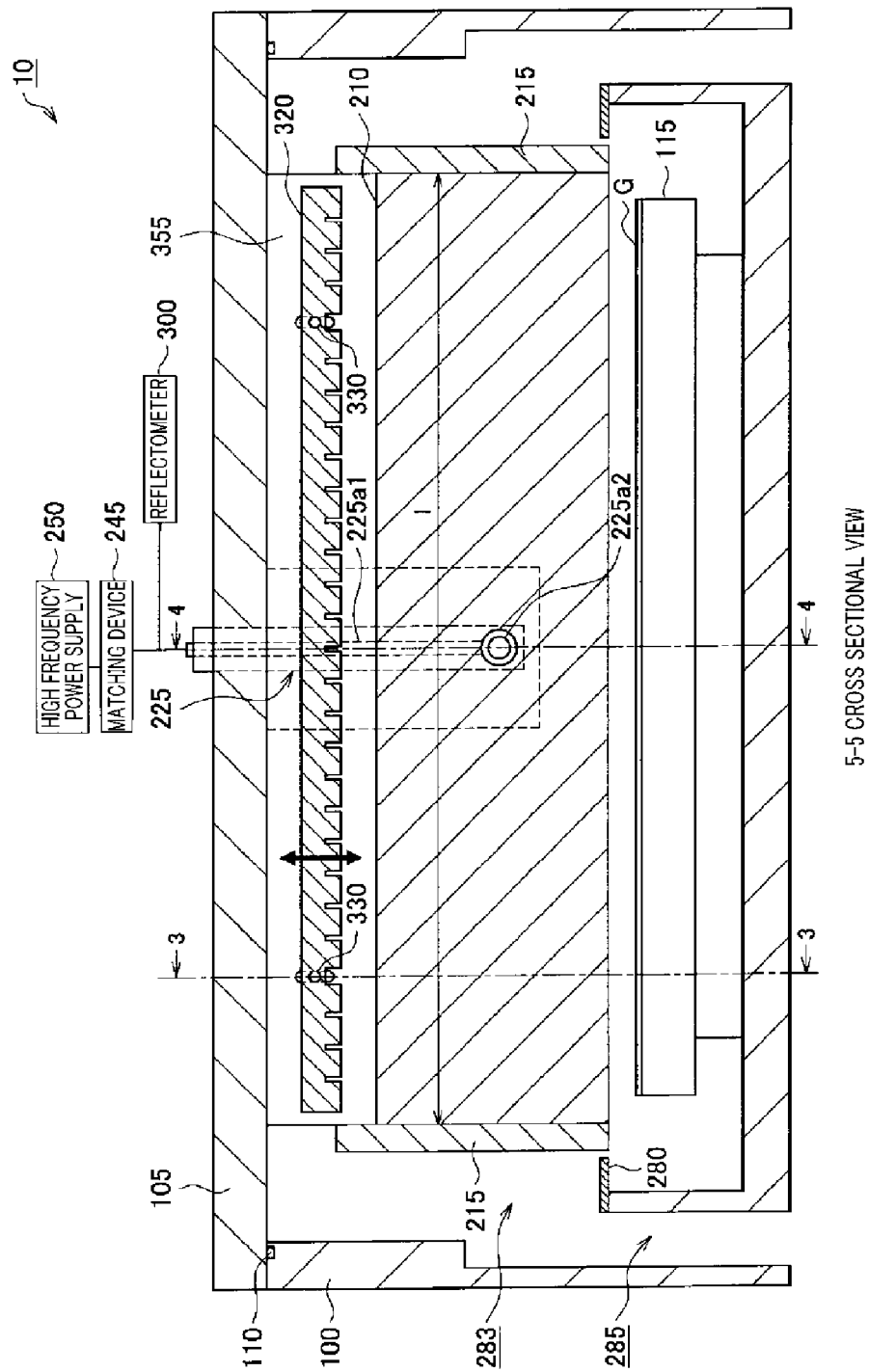
FIG. 7 is a longitudinal cross sectional view (taken along a line 5-5 of FIG. 6) of the plasma processing apparatus in accordance with the second illustrative embodiment.

A schematic configuration of a plasma processing apparatus in accordance with a second illustrative embodiment will be explained with reference to FIGS. 6 and 7. The left half of FIG. 6 is a cross sectional view taken along a line 3-3 of FIG. 7. The right half of FIG. 6 is a cross sectional view taken along a line 4-4 of FIG. 7. FIG. 7 is a cross sectional view taken along a line 5-5 of FIG. 6. The left half of FIG. 6 shows a cross section of a part where no coaxial waveguide is provided, and the right half of FIG. 6 shows a cross section of a part where a coaxial waveguide is provided.

Since the basic configuration of the plasma processing apparatus 10 in accordance with the second illustrative embodiment is the same as that of the plasma processing apparatus in accordance with the first illustrative embodiment, below explanation will be focused on only the different configuration. In the plasma processing apparatus 10 in accordance with the second illustrative embodiment, a multiple number of long narrow electrode pairs 200 are arranged in parallel to each other in a widthwise direction of the dielectric slit. A first waveguide plate 325a and a second waveguide plate 325b are fastened to upper portions of electrode members 200a and 200b by screws (not shown), respectively. A lengthwise direction of the first waveguide plate 325a and the second waveguide plate 325b coincides with a direction perpendicular to the paper plane of FIG. 6. The first waveguide plate 325a and the second waveguide plate 325b are made of a metal such as an aluminum alloy. The first waveguide plate 325a, the second waveguide plate 325b, and a short-circuit plate 355 are fastened by a screw (not shown) to a fastening plate 356 made of a metal. The fastening plate 356 is fastened to a lid 105 by a screw (not shown).

A gap between the waveguide plates 325a and 325b serves as a waveguide path 205. A dielectric plate 210 made of alumina or the like is inserted in a lower portion of the waveguide path 205.

In the plasma processing apparatus 10 in accordance with the second illustrative embodiment, a pitch between the electrode pairs is short. Accordingly, in order to obtain a space for the first gas exhaust path 281 between the electrode pairs, a thickness of the waveguide plates 325a and 325b (i.e., a thickness of a wall surface of the waveguide path) is set to be thin as, e.g., about 3 mm. Between the adjacent electrode pairs, a spacer 350 is fastened to the waveguide plates 325a and 325b by insulating screws 401. The spacer 350 may be formed of a metal or an insulator.

As shown in FIG. 6, the first electrode 200a and the second electrode 200b, a gas flow path elongated in a direction perpendicular to the paper plane of FIG. 6 are formed. The gas flow path 290a is provided with a multiple number of gas discharge holes formed at a lower portion thereof. A gas that has flown in the gas flow path 290a is discharged toward a substrate G through the gas discharge holes. In the plasma processing apparatus of the second illustrative embodiment, since the waveguide plates 325a and 325b are thin, heat introduced into the electrode from plasma cannot be transferred to the lid 105. Thus, in each of the first electrodes 200a and the second electrodes 200b, a coolant path 295a is formed. The coolant path 295a is elongated in the direction perpendicular to the paper plane. With this configuration, the electrodes are cooled directly by a coolant.

In the plasma processing apparatus 10 of the second illustrative embodiment in which a gap between the electrodes and the substrate is short and the pitch between the electrode pairs is short, there is no space that is formed to face the internal conductor 225a2 of the coaxial waveguide 225, unlike in the plasma processing apparatus 10 in accordance with the first illustrative embodiment. Accordingly, as shown in the right half of FIG. 6, two internal conductors 225a2 are connected to both sides of an internal conductor 225a1, and both ends of the internal conductors 225a2 are fastened by nuts 370 via insulating rings 365. In this way, the internal conductors 225a2 are connected to two adjacent waveguide paths. By way of example, the internal conductors 225a2 are made of nickel-plated copper.

If the pitch between the electrode pairs is long as in the plasma processing apparatus 10 in accordance the first illustrative embodiment (FIG. 1), the inside of the coaxial waveguide 225 is under the atmosphere. In the plasma processing apparatus 10 in accordance with the second illustrative embodiment, on the other hand, the inside of the coaxial waveguide 225 is under the vacuum. As a result, the inside of the coaxial waveguide may be easily electrically discharged. In order to prevent this problem, the inside of the coaxial waveguide 225 is filled with a dielectric material such as Teflon (registered trademark), alumina, or quartz. Further, the inside of the coaxial waveguide 225 is hermetically sealed against the atmosphere by an O-ring 345.

Here, a cut-off state of a waveguide path will be explained. First, a wavelength (hereinafter, referred to as an "guide wavelength") within a rectangular waveguide having a cross section with a long side length (a) and a short side length (b) is estimated. The guide wavelength $\lambda_g$ is presented by the equation (1) below.

[Equation (1)]

$$\lambda_g = \frac{\lambda}{\sqrt{\varepsilon_r \mu_r} \sqrt{1 - \lambda/2a}} \quad (1)$$

Here, $\lambda$ is a wavelength in vacuum; $\varepsilon_r$ is a relative permittivity in the waveguide; and $\mu_r$ is a relative permeability in the waveguide. According to the equation (1), it is understood that if $\varepsilon_r = \mu_r = 1$, the guide wavelength $\lambda_g$ of the waveguide is always longer than the wavelength in vacuum ($\lambda$). If $\lambda < 2a$, the guide wavelength $\lambda_g$ increases as the long side length (a) becomes short. If $\lambda = 2a$, namely, when the long side length (a) becomes equal to ½ of the wavelength in vacuum ($\lambda$), the denominator becomes 0, so that the guide wavelength $\lambda_g$ becomes infinite. At this time, the waveguide comes into a cut-off state, where a phase velocity of an electromagnetic wave propagating in the waveguide becomes infinite and a group velocity becomes 0. If $\lambda > 2a$, the electromagnetic wave cannot propagate in the waveguide, though it may enter the waveguide by some distance. Generally, this state is also called a cut-off state, but here, the state in case of $\lambda = 2a$ is referred to as a cut-off state.

In the plasma processing apparatus 10 in accordance with the second illustrative embodiment, the waveguide path 205 may be regarded as a transmission path formed by dividing the rectangular waveguide into two parts in the lengthwise direction thereof. That is, in FIG. 6, the short side of the waveguide path 205 corresponds to the short side of the rectangular waveguide, and the long side of the waveguide path 205 corresponds to ½ of the long side of the rectangular waveguide. If a wavelength of a high frequency power propagating in the waveguide path 205 in the direction perpendicular to the paper plane is sufficiently lengthened by adjusting the height (the length of the long side) of the waveguide path 205 to allow the waveguide path 205 to come into the cut-off state, a uniform high frequency electric field may be discharged along a lengthwise direction of the dielectric slit and uniform plasma may be excited. Since impedance of the plasma varies depending on conditions, a device to adjust the height of the waveguide path 205 is required in order to allow an apparatus to generate uniform plasma regardless of a variation in the conditions.

In the plasma processing apparatus 10 in accordance with the second illustrative embodiment, the height of the waveguide path 205 is changed by moving an upper wall of the waveguide path 205. In an upper portion of the dielectric slit, a metal brush 320 is inserted to short-circuit the first waveguide plate 325a and the second waveguide plate 325b. The metal brush 320 is made of a metal having elasticity such as stainless steel or phosphor bronze. The metal brush 320 is positioned at the upper wall of the waveguide path 205. A first supporting rod 330 made of a metal penetrates a multiple number of metal brushes 320. The first supporting rod 330 is connected to a second supporting rod 335. The second supporting rod 335 is connected to a driving device 310 outside the apparatus. A gap between the second supporting rod 335 and the lid 105 is hermetically sealed by a bellows 340.

Each metal brush 320 is movable. By moving the first supporting rod 330 up and down by operating the driving device 310, the multiple number of the metal brushes 320 connected to the first supporting rod 330 are moved up and down as one body. Accordingly, the height of the waveguide path can be changed. The movement range of the metal brush 320 is from a top surface of the dielectric plate 210 to a bottom surface of the lid 105.

If impedance viewed from the dielectric slit toward plasma is infinite, for example, the waveguide path 205 may be regarded as a transmission path formed by exactly halving the rectangular waveguide in the lengthwise direction thereof. Accordingly, when the height of the waveguide path 205 is $\lambda$, namely, i.e., when an electric field in a normal direction of the dielectric slit of the waveguide path 205 is exactly $\pi/2$, an guide wavelength $\lambda_g$ becomes infinite. Actually, however, since the impedance viewed from the dielectric slit toward the plasma has a certain value, the electric field in the normal direction of the dielectric slit of the waveguide path 205, which makes the guide wavelength $\lambda_g$ infinite, may become smaller than about $\pi/2$.

Actually, while a plasma process is being performed, a distribution of an electromagnetic field or a distribution of plasma in the waveguide path 205 cannot be measured, generally. Thus, there is required a method for indirectly detecting a cut-off state and adjusting the height of the waveguide path 205 from the outside of the plasma processing apparatus. As will be described later, by optimizing a dimension of each component, it may be possible to minimize an absolute value of a reflection coefficient viewed from the coaxial waveguide 225 that supplies a high frequency power when the coaxial waveguide 225 is in the cut-off state. That is, by measuring a reflection viewed from the coaxial waveguide 225 and adjusting the height of the waveguide path in such a way to minimize the reflection, uniform plasma may be obtained.

Accordingly, in the second illustrative embodiment, a reflectometer 300 is provided between a matching device 245 and the coaxial waveguide 225 to monitor the state of the reflection viewed from the coaxial waveguide 225. A detection value from the reflectometer 300 is inputted to a controller 305. Based on the detection value, the controller 305 instructs the driving device 310 to move the first supporting rod 330 up and down in a required amount. If the first supporting rod 330 is moved up and down by the driving force of the driving device 310, the metal brushes 320 are also moved up and down as one body. In this way, by adjusting the height of the waveguide path, the reflection viewed from the coaxial waveguide 225 may be minimized. Through this control, the reflection can be suppressed to be small. Thus, the matching device 245 may be omitted, and the coaxial waveguide 225 may be connected directly to the high frequency power supply 250. The reflectometer may measure only an absolute value of a reflection power or a reflection coefficient, or may also measure a value including a phase.

As explained above, in accordance with the second illustrative embodiment, the guide wavelength $\lambda_g$ is controlled to be lengthened by adjusting the height of the waveguide path. However, a question arises as to how long the guide wavelength $\lambda_g$ should be, that is, an upper limit of the guide wavelength $\lambda_g$ should be considered. It may be desirable that the guide wavelength $\lambda_g$ of the waveguide path is set to be equal to or larger than about seven times the length l of a waveguide path illustrated in FIG. 7. The ground for setting this upper limit is explained below.

(Guide Wavelength $\lambda_g$)

A distribution of a standing wave generated in the waveguide path is presented by the following equation.

[Equation (2)]

$$E(x) = A \left| 1 + \exp\left(-j2\frac{2\pi}{\lambda_g}x\right) \right| \quad (2)$$

Here, E is an electric field intensity applied to a bottom surface of a waveguide path; x is a position in a lengthwise direction of the waveguide path with respect to a periphery of the waveguide path; A is a proportional constant; and $\lambda_g$ is a guide wavelength of the waveguide path. A ratio between an electric field intensity E(½) in the center portion of the waveguide path and an electric field intensity E(0) in an end portion of the waveguide path is K. Here, l is a length of the waveguide path. From the equation (2), the following equation is obtained.

[Equation (3)]

$$\lambda_g = \frac{2\pi}{\arccos(2K^2 - 1)} l \quad (3)$$

In order to excite uniform plasma, practically, it is desirable that the electric field intensity in the center portion of the waveguide path is equal to or higher than about 0.9 times the electric field intensity in the end portion of the waveguide path. In case of K=0.9, from the equation (3), the following equation is obtained:

$$\lambda_g \cong 7l \quad \text{[Equation (4)]}$$

That is, according to equation (4), it is desirable that the guide wavelength $\lambda_g$ of the waveguide path is equal to or larger than about seven times the length l of the waveguide path.

(Upward and Downward Movement of Metal Brush and Cut-Off)

Figure 8:
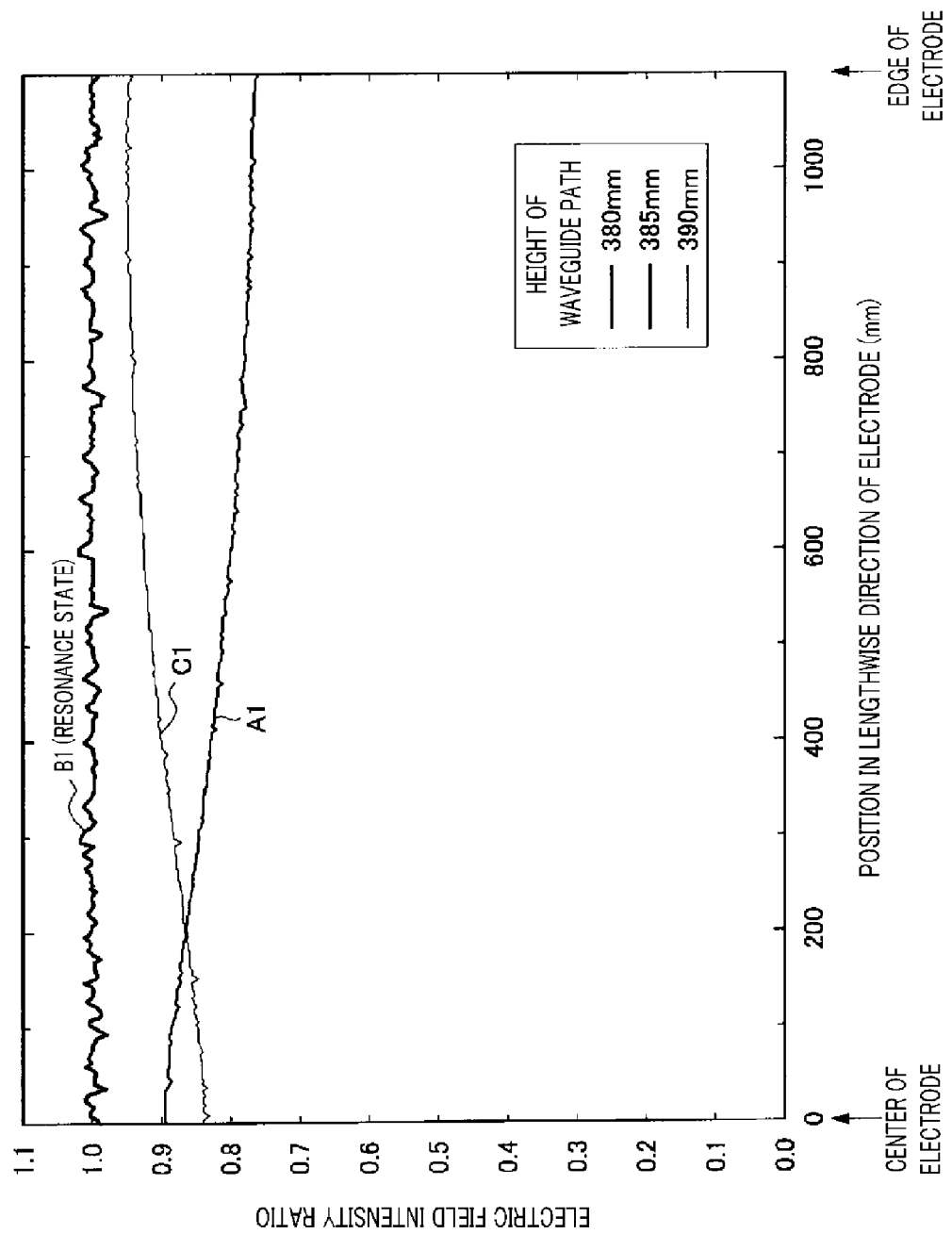
FIG. 8 is a graph showing a relationship between a position in a lengthwise direction of an electrode and an electric field intensity ratio in accordance with the second illustrative embodiment.

FIG. 8 provides a result of calculating an electric field intensity distribution in a sheath on an electrode surface in the configuration of FIG. 7 by electromagnetic field simulation. A horizontal axis refers to a position in a lengthwise direction of the electrode with respect to a center of the electrode. A curve A1 represents a case where the height of the waveguide path is about 380 mm; a curve B1 represents a case where the height of the waveguide path is about 385 mm; and a curve C1 represents a case where the height of the waveguide path is about 390 mm. A plasma excitation frequency is set to about 60 MHz. A sheath thickness is about 0.5 mm. A relative permittivity of plasma is about −55. A dielectric loss of plasma is about −14. A pitch between electrode pairs in a widthwise direction of the electrode is about 50 mm. A gap between electrodes and the substrate is about 10 mm. A length of the electrodes is about 2200 mm.

With these conditions, when the height of the waveguide path is about 385 mm (curve B1), the waveguide path becomes exactly cut-off with respect to an overall lengthwise direction thereof. In this case, like the rectangular waveguide in the cut-off state, a guide wavelength is sufficiently lengthened. Since the guide wavelength is sufficiently long, no standing wave is generated, and, as in FIG. 8, a very uniform electric field is generated in the lengthwise direction of the electrode. An absolute value of a reflection coefficient viewed from the coaxial waveguide is minimized to about 0.01.

When the height of the waveguide path is set to about 380 mm (curve A1), slightly lower than that in the cut-off state, a high frequency power cannot propagate in the lengthwise direction of the waveguide path. As a result, an electric field intensity becomes the strongest near a coaxial waveguide formed at the center portion of the electrode, and the electric field intensity gradually decreases as being distanced apart from that coaxial waveguide. An absolute value of the reflection coefficient viewed from the coaxial waveguide increases to about 0.59.

On the contrary, when the height of the waveguide path is set to about 390 mm (curve C1), slightly higher than that in the cut-off state, a high frequency power can propagate in the lengthwise direction of the waveguide path. Since an end portion of the electrode in the lengthwise direction thereof is in a floating state, the electric field intensity near the end portion of the electrode becomes the strongest. An absolute value of the reflection coefficient viewed from the coaxial waveguide is about 0.44, which is larger as compared to that of the cut-off state.

By moving the metal brushes 320 upward and downward to adjust the height of the waveguide path and make the waveguide path come into the cut-off state, it is possible to excite very uniform plasma on an electrode having a size equal to or larger than about 2 m square. When the waveguide path comes into the cut-off state, the absolute value of the reflection coefficient viewed from the coaxial waveguide becomes minimized. Accordingly, the metal brushes 320 needs to be moved to minimize the reflection.

As explained above, in accordance with the plasma processing apparatus 10 of the second illustrative embodiment, by moving the metal brushes up and down to sufficiently lengthen the guide wavelength of the waveguide path, it may be possible to excite very uniform plasma in the lengthwise direction of the electrode even if a high frequency in a high frequency band is used. Since a coaxial waveguide only needs to be positioned at the center portion of a long electrode, the number of electrodes, the number of coaxial waveguides, the number of matching devices, the number of high frequency power supplies, and so on can be greatly reduced, as compared to the first illustrative embodiment.

Third Illustrative Embodiment

Configuration of Plasma Processing Apparatus

Figure 9:
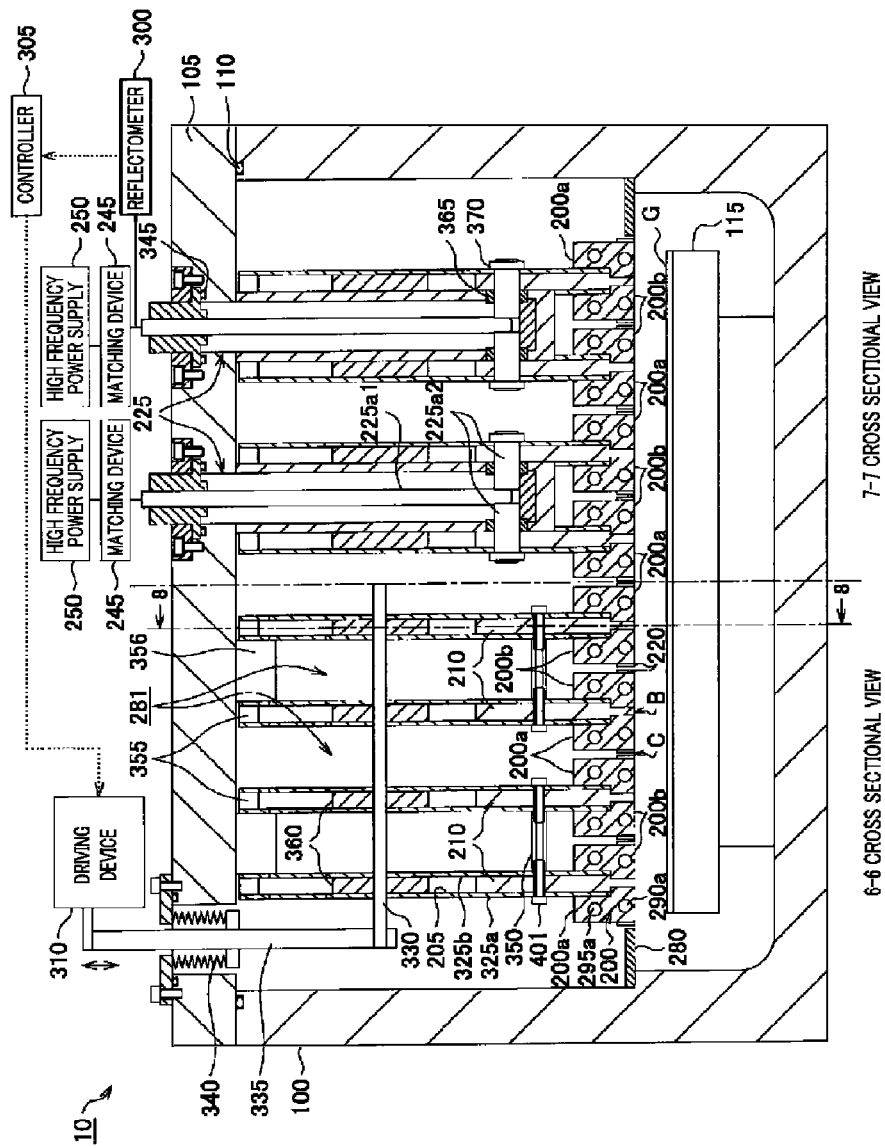
FIG. 9 is a longitudinal cross sectional view (taken along lines 6-6 and 7-7 of FIG. 10) of a plasma processing apparatus in accordance with a third illustrative embodiment.
Figure 10:
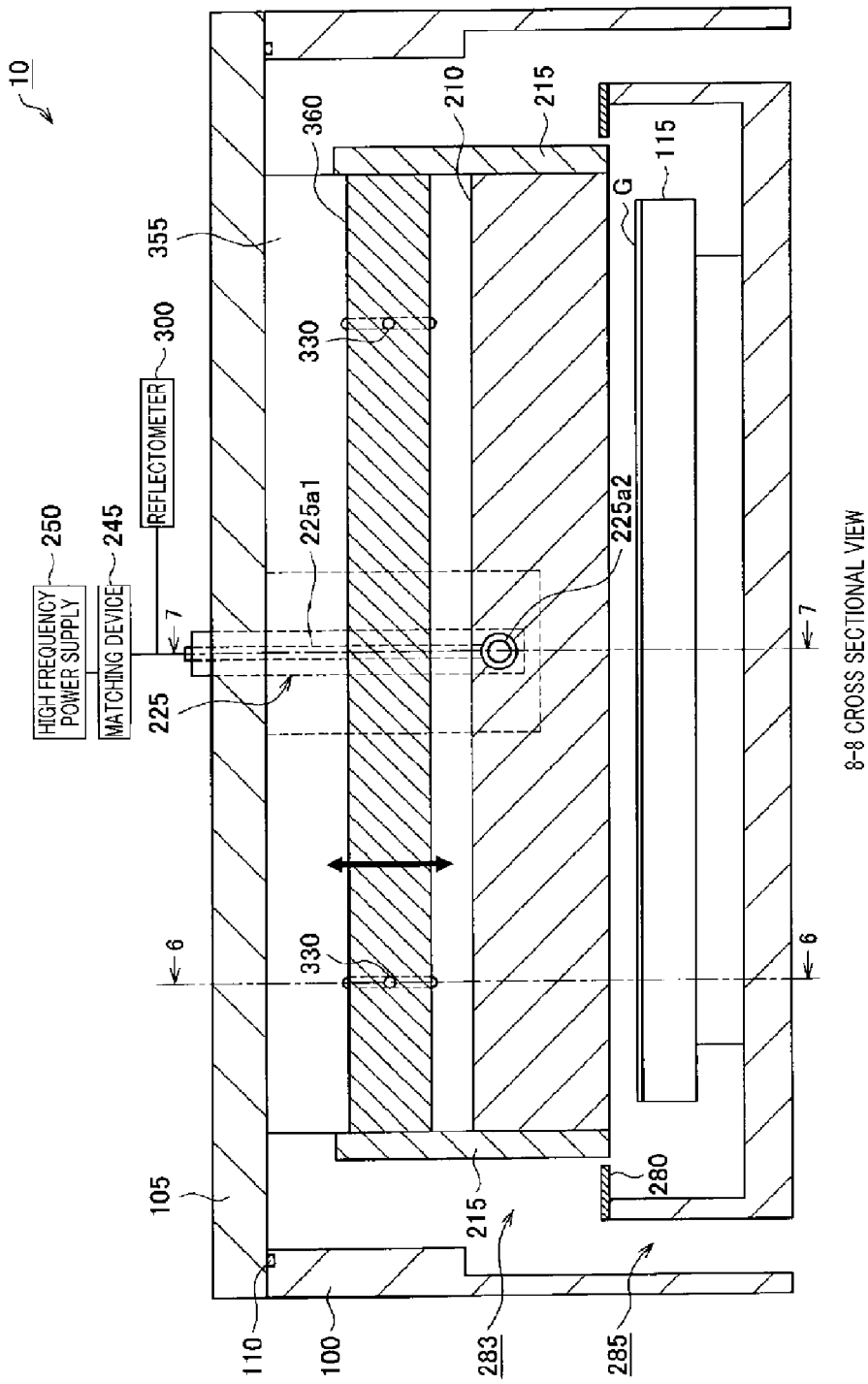
FIG. 10 is a longitudinal cross sectional view (taken along a line 8-8 of FIG. 9) of a plasma processing apparatus in accordance with the third illustrative embodiment.

A cut-off type plasma processing apparatus 10 in accordance with a third illustrative embodiment is different from the second illustrative embodiment in that dielectric plungers are used instead of the metal brushes. Accordingly, focusing on this difference, a schematic configuration of the plasma processing apparatus in accordance with the third illustrative embodiment will be explained with reference to FIGS. 9 and 10. The left half of FIG. 9 is a cross sectional view taken along a line 6-6 of FIG. 10. The right half of FIG. 9 is a cross sectional view taken along a line 7-7 of FIG. 10. FIG. 10 is a cross sectional view taken along a line 8-8 of FIG. 9. The left half of FIG. 9 is a cross section of a part where no coaxial waveguide is provided. The right half of FIG. 9 is a cross section of a part where a coaxial waveguide is provided.

In an upper portion of a dielectric slit between waveguide plates 325a and 325b, a dielectric plunger 360, instead of a metal brush, is inserted. The dielectric plunger 360 is made of a dielectric material such as alumina. The first waveguide plate 325a and the second waveguide plate 325b are short-circuited by a short-circuit plate 355. The first supporting rod 330 made of a dielectric material penetrates a multiple number of the dielectric plungers 360. The first supporting rod 330 is connected to the second supporting rod 335. The driving device 310 is disposed at an upper portion of the second supporting rod 335. A gap between the second supporting rod 335 and the lid 105 is hermetically sealed by the bellows 340.

Each dielectric plunger 360 is movable. By moving the first supporting rod 330 up and down by a driving force of the driving device 310, all the dielectric plungers 360 are moved up and down as one body. Accordingly, an effective height of a waveguide path can be adjusted. Since an upper portion of the waveguide path is short-circuited, an electric field in a lower portion of the waveguide plates 325a and 325b is strong, and an electric field in an upper portion of the coaxial waveguide plates 325a and 325b is weak. Accordingly, as the dielectric plunger 360 is moved downward (i.e., toward the portion where the electric field is strong), the effective height of the waveguide path increases. As the dielectric plunger 360 is moved upward (i.e., toward the portion where the electric field is weak), the effective height of the waveguide path decreases.

(Upward and Downward Movement of Dielectric Plungers and Cut-Off)

Figure 11:
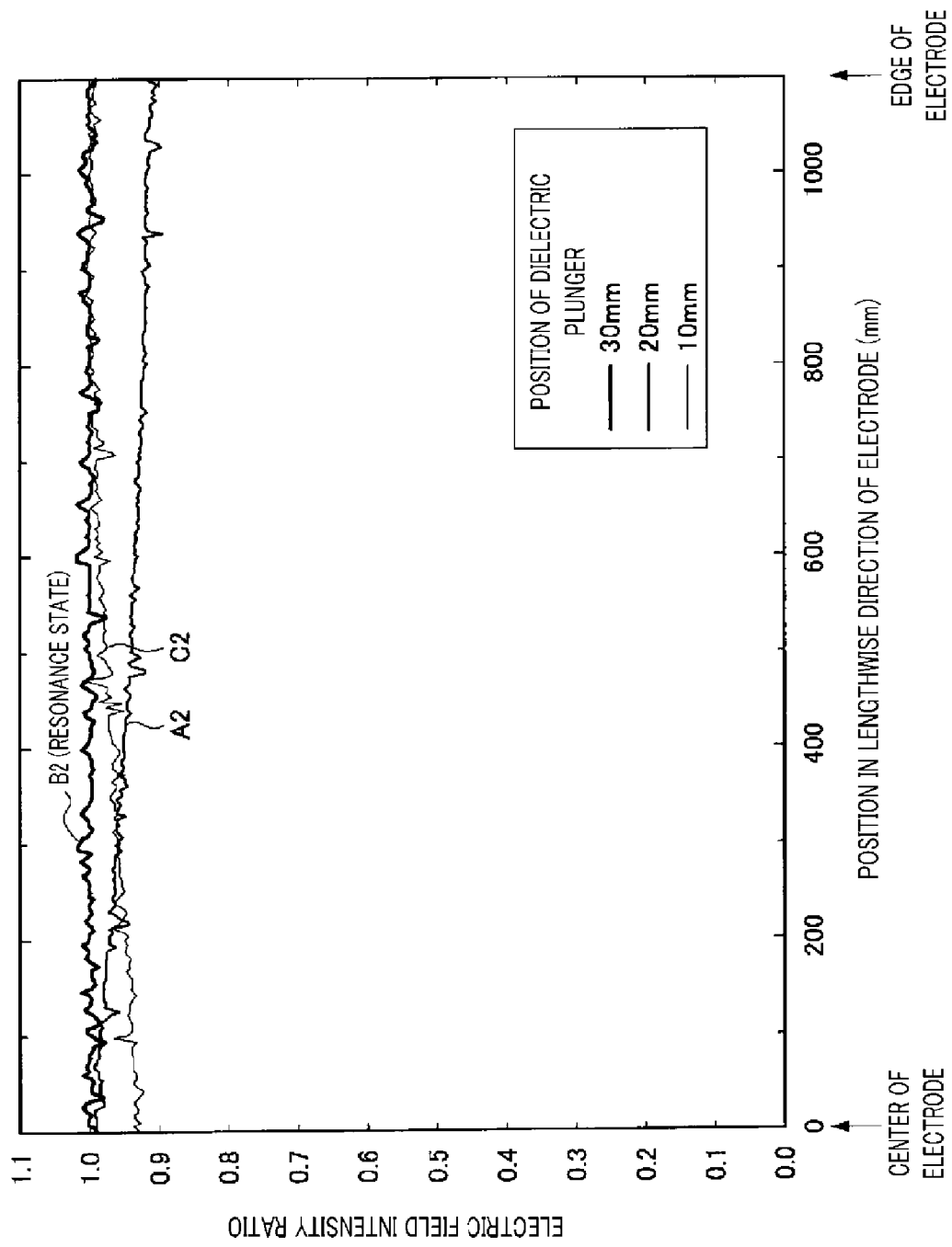
FIG. 11 is a graph showing a relationship between a position in a lengthwise direction of an electrode and an electric field intensity ratio in accordance with the third illustrative embodiment.

FIG. 11 provides a result of calculating an electric field intensity distribution in a sheath on an electrode surface in the configuration of the plasma processing apparatus 10 illustrated in FIG. 9 by electromagnetic field simulation. A curve A2 represents a case where a distance between the dielectric plunger 360 and a dielectric plate 210 is about 30 mm. A curve B2 represents a case where the distance is about 20 mm. A curve C2 represents a case where the distance is about 10 mm. Other conditions used in the calculation are the same as those used in FIG. 8.

As a result, when the distance between the dielectric plunger 360 and the dielectric plate 210 is set to about 20 mm (curve B2), the waveguide path is cut-off in the overall lengthwise direction thereof, and a uniform electric field is generated in a lengthwise direction of the electrode. In this case, an absolute value of a reflection coefficient viewed from the coaxial waveguide is about 0.01.

When the distance between the dielectric plunger 360 and the dielectric plate 210 is set to about 30 mm (curve A2), which is larger than that in the cut-off state, an effective height of the waveguide path decreases, and a high frequency power cannot propagate in the lengthwise direction of the waveguide path. Accordingly, an electric field becomes strong near a coaxial waveguide formed at a center portion of the electrode and gradually decreases as being distanced apart from the coaxial waveguide. In this case, an absolute value of a reflection coefficient viewed from the coaxial waveguide is about 0.44.

On other hand, when the distance between the dielectric plungers 360 and the dielectric plate 210 is set to about 10 mm (curve C2), smaller than that in the cut-off state, a high frequency power can propagate in the lengthwise direction of the waveguide path. Since an end portion of the electrode in the lengthwise direction is in a floating state, an electric field intensity near the end portion becomes the strongest. In this case, an absolute value of the reflection coefficient viewed from the coaxial waveguide is about 0.25.

In this way, by adjusting the position of the dielectric plunger 360 to allow the waveguide path to come into the cut-off state, it may be possible to excite very uniform plasma on an electrode having a size equal to or larger than about 2 m square. When the waveguide comes into the cut-off state, the absolute value of the reflection coefficient viewed from the coaxial waveguide is minimized in the cut-off state. Thus, the dielectric plunger 360 needs to be moved to minimize the reflection.

Fourth Illustrative Embodiment

Configuration of Plasma Processing Apparatus

In the cut-off type plasma processing apparatus 10 in accordance with the second and third illustrative embodiments, the metal brushes 320 or the dielectric plungers 360, which are movable members, are moved up and down in vacuum. Due to the movement, dust may be generated so that the inside of a processing chamber is contaminated.

Figure 12:
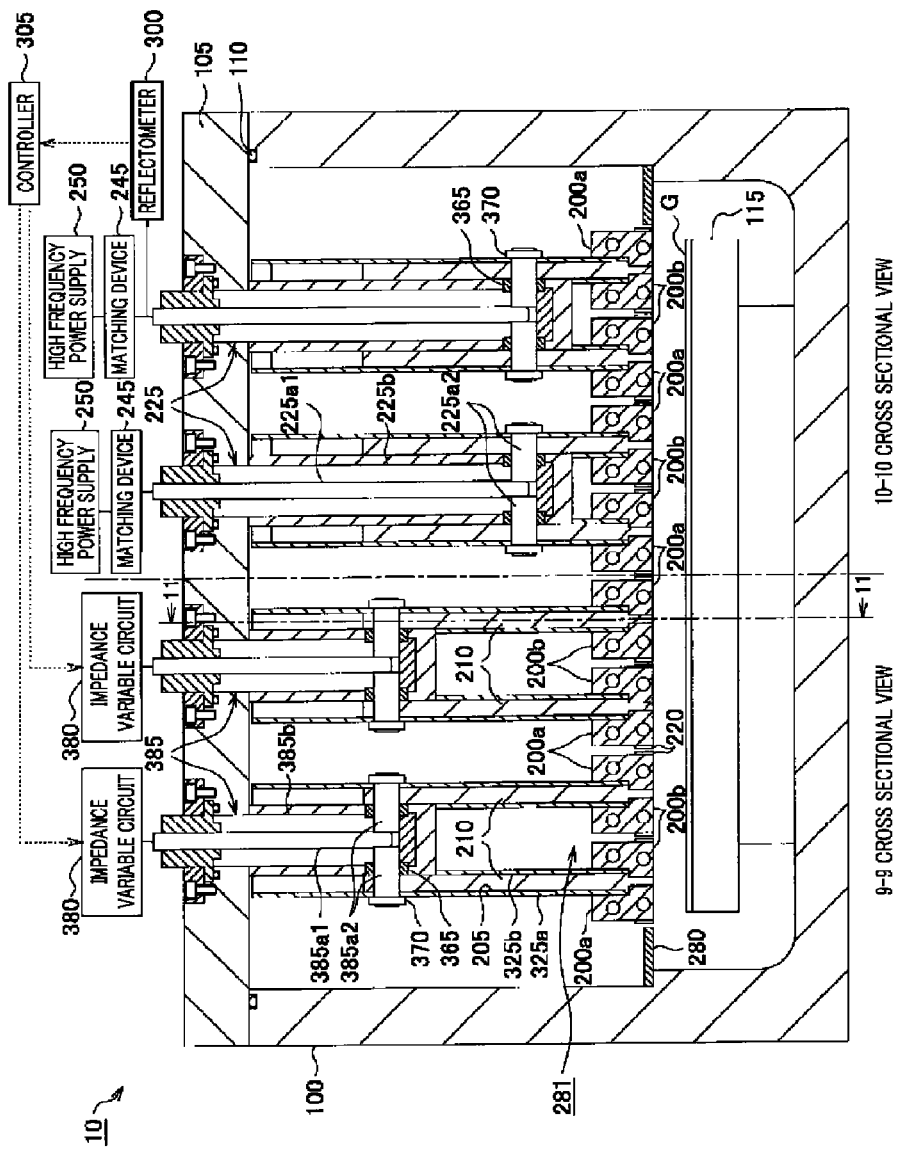
FIG. 12 is a longitudinal cross sectional view (taken along lines 9-9 and 10-10 of FIG. 13) of a plasma processing apparatus in accordance with a fourth illustrative embodiment.
Figure 13:
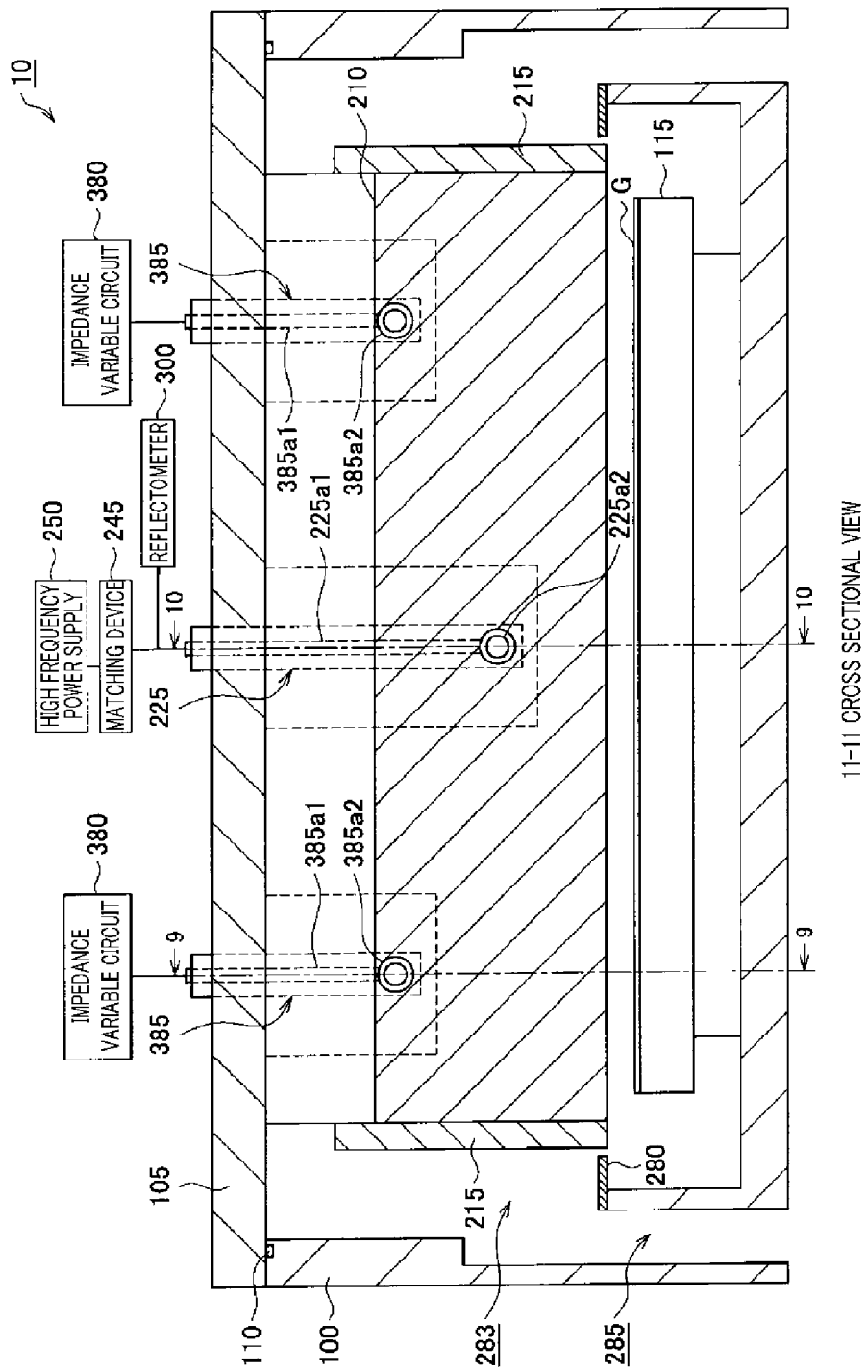
FIG. 13 is a longitudinal cross sectional view (taken along a line 11-11 of FIG. 12) of the plasma processing apparatus in accordance with the fourth illustrative embodiment.

Thus, in a cut-off type plasma processing apparatus 10 in accordance with a fourth illustrative embodiment, in order to avoid the contamination of the inside of the processing chamber, impedance variable circuits are used instead of the metal brushes 320 or the dielectric plungers 360. Accordingly, focusing on the impedance variable circuits, a schematic configuration of the plasma processing apparatus in accordance with the fourth illustrative embodiment will be explained with reference to FIGS. 12 and 13. The left half of FIG. 12 is a cross sectional view taken along a line 9-9 of FIG. 13. The right half of FIG. 12 is a cross sectional view taken along a line 10-10 of FIG. 13. FIG. 13 is a cross sectional view taken along a line 11-11 of FIG. 12.

In a lower portion of a dielectric slit between waveguide plates 325a and 325b, a dielectric plate 210 is inserted. In an upper portion of the dielectric slit, no movable member is inserted. In accordance with the fourth illustrative embodiment, in order to electrically adjust an effective height of a waveguide path, an impedance variable circuit 380 is provided. In addition to a coaxial waveguide 225 that is provided in a center portion of the electrode in a lengthwise direction thereof to supply a high frequency power, two coaxial waveguides 385 are formed near both the ends of the electrode in the lengthwise direction thereof. The coaxial waveguides 385 are connected to two impedance variable circuits 380, respectively. In order not to impede a gas flow in a first gas exhaust path 281, an internal conductor 385$a2$ of the coaxial waveguide 385 is located at a position higher than an internal conductor 225$a2$ of the coaxial waveguide.

Configuration examples of the impedance variable circuit 380 are illustrated in FIG. 14. By way of examples, the structure 380$a$ only including the variable capacitor, the structure 380$b$ including the variable capacitor and the coil which are connected in parallel, the structure 380$c$ including the variable capacitor and the coil which are connected in series, or like may be used.

In accordance with the fourth illustrative embodiment as well, an effective height of the waveguide path is adjusted such that a reflection viewed from the coaxial waveguide 225 is minimized when a waveguide path is in a cut-off state. It is desirable to adjust the effective height of the waveguide path even during a process. Accordingly, in the present illustrative embodiment, a reflectometer 300 is provided between a matching device 245 and the coaxial waveguide 225 to monitor the state of the reflection viewed from the coaxial waveguide 225. A detection value from the reflectometer 300 is inputted to a controller 305. The controller 305 instructs the impedance variable circuit 380 to be adjusted based on the detection value. In this way, by adjusting the effective height of the waveguide path, the reflection viewed from the coaxial waveguide 225 may be minimized. Since the reflection coefficient can be adjusted to be a small value through the above-described control, the matching device 245 may not be provided.

Figure 15:
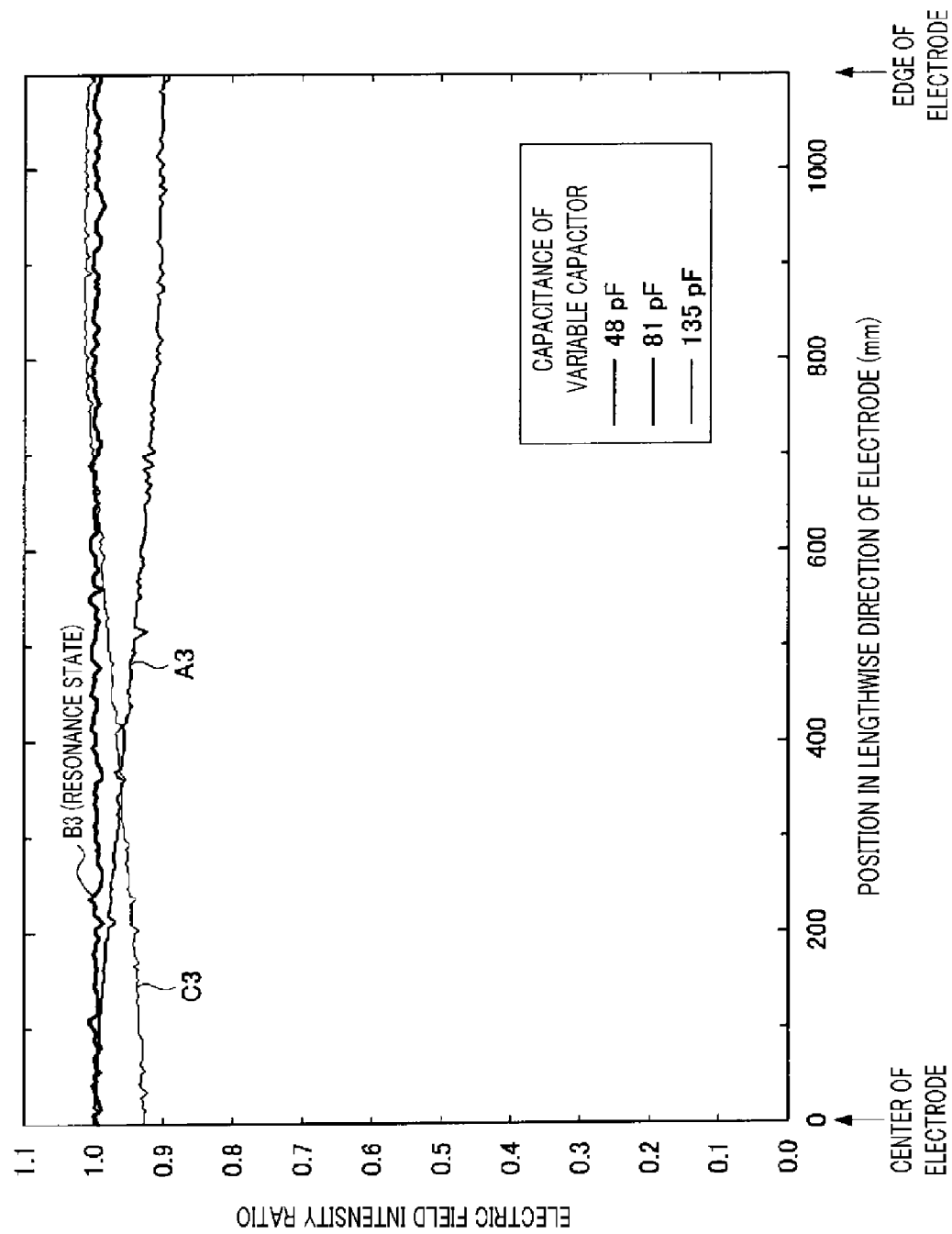
FIG. 15 is a diagram showing a position in a lengthwise direction of an electrode and an electric field intensity ratio in accordance with the fourth illustrative embodiment.

FIG. 15 provides a result of calculating an electric field intensity distribution in a sheath on an electrode surface in the plasma processing apparatus 10 of FIG. 12 by electromagnetic field simulation. As the impedance variable circuit 380, a variable capacitor having the structure 380$a$ illustrated in FIG. 14 is used. That is, the variable capacitor is connected between the external conductor and the internal conductor at an upper end of the coaxial waveguide 385. A length of the coaxial waveguide is about 300 mm. Quartz is filled between the internal conductor and the external conductor. A curve A3 represents a case where a capacitance of the variable capacitor is about 48 pF; a curve B3 represents a case where the capacitance is about 81 pF; and a curve C3 represent a case where the capacitance is about 135 pF. Other conditions used in the calculation are the same as those used in FIG. 8.

As a result, when the capacitance of the variable capacitor is set to about 81 pF (curve B3), the waveguide path comes into a cut-off state in the overall lengthwise direction, and a uniform electric field is generated in a longitudinal direction of the electrode. In this case, an absolute value of a reflection coefficient viewed from the coaxial waveguide 225 is about 0.01.

When the capacitance of the variable capacitor is set to about 48 pF (curve A3), which is smaller than that in the cut-off state, an effective height of the waveguide path decreases, and a high frequency power cannot propagate in the lengthwise direction of the waveguide path. Accordingly, an electric field becomes the strongest near a coaxial waveguide formed in the center portion of the electrode and gradually decreases as being distanced apart from the coaxial waveguide. In this case, an absolute value of the reflection coefficient viewed from the coaxial waveguide 225 is about 0.32.

On the contrary, when the capacitance of the variable capacitor is set to about 135 pF (curve C3), which is larger than that in the cut-off state, a high frequency power can propagate in the lengthwise direction of the waveguide path. Since an end portion of the electrode in the lengthwise direction of the electrode is in a floating state, an electric field intensity near the end portion becomes the strongest. In this case, an absolute value of the reflection coefficient viewed from the coaxial waveguide 225 is about 0.19.

By adjusting the capacitance of the variable capacitor to allow the waveguide path to come into the cut-off state, it is possible to excite very uniform plasma on an electrode having a size equal to or larger than about 2 m square. In the cut-off state, the absolute value of the reflection coefficient viewed from the coaxial waveguide is minimized. Thus, the capacitance of the variable capacitor needs to be set to minimize the reflection.

As described above, in accordance with the plasma processing apparatuses 10 of the above-described illustrative embodiments, it is possible to excite uniform plasma on a large-size substrate even when a plasma excitation frequency is set to be high.

Fifth Illustrative Embodiment

Configuration of Plasma Processing Apparatus

Figure 16:
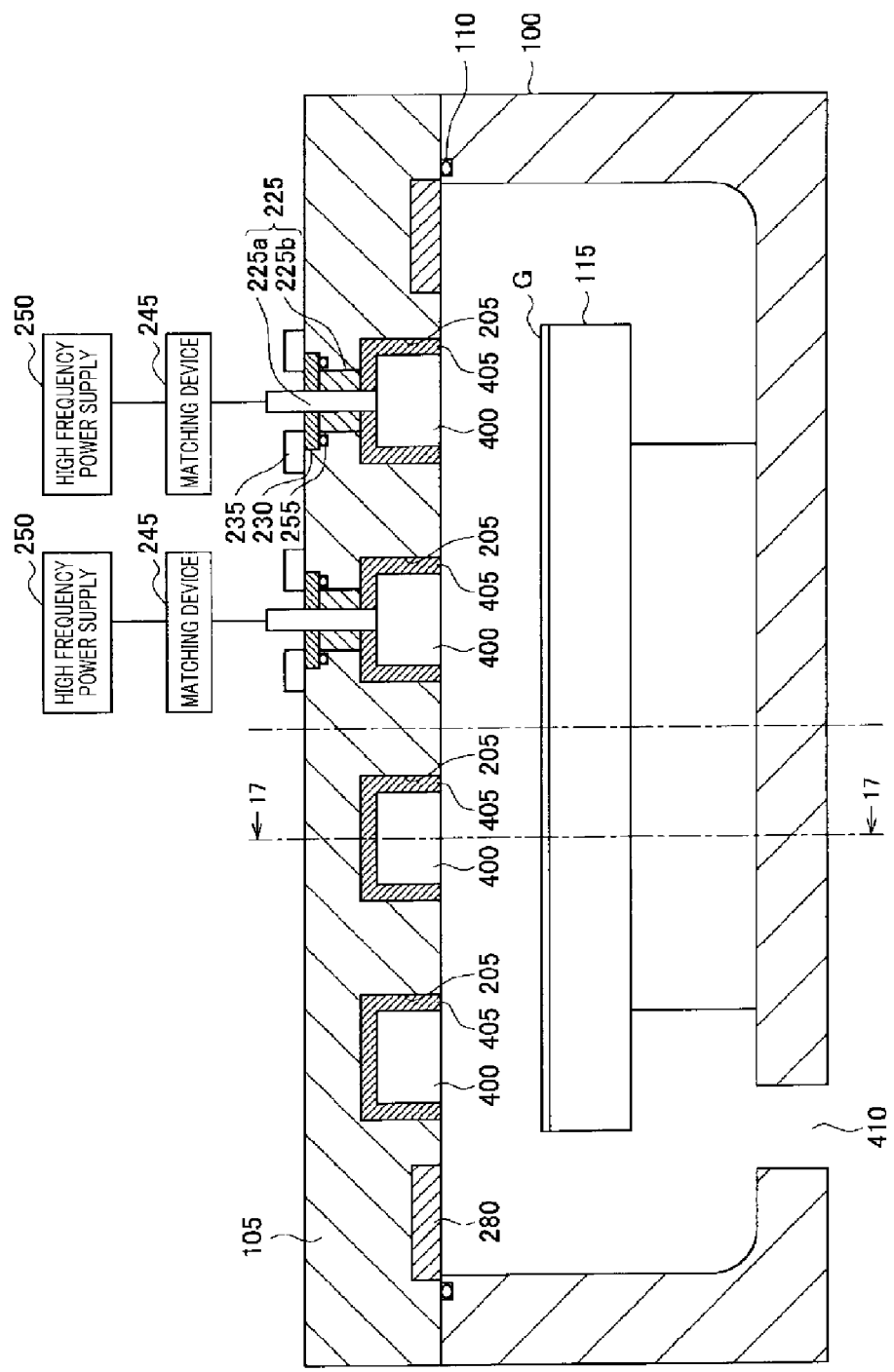
FIG. 16 is a longitudinal cross sectional view (taken along lines 15-15 and 16-16 of FIG. 17) of a plasma processing apparatus in accordance with a fifth illustrative embodiment.
Figure 17:
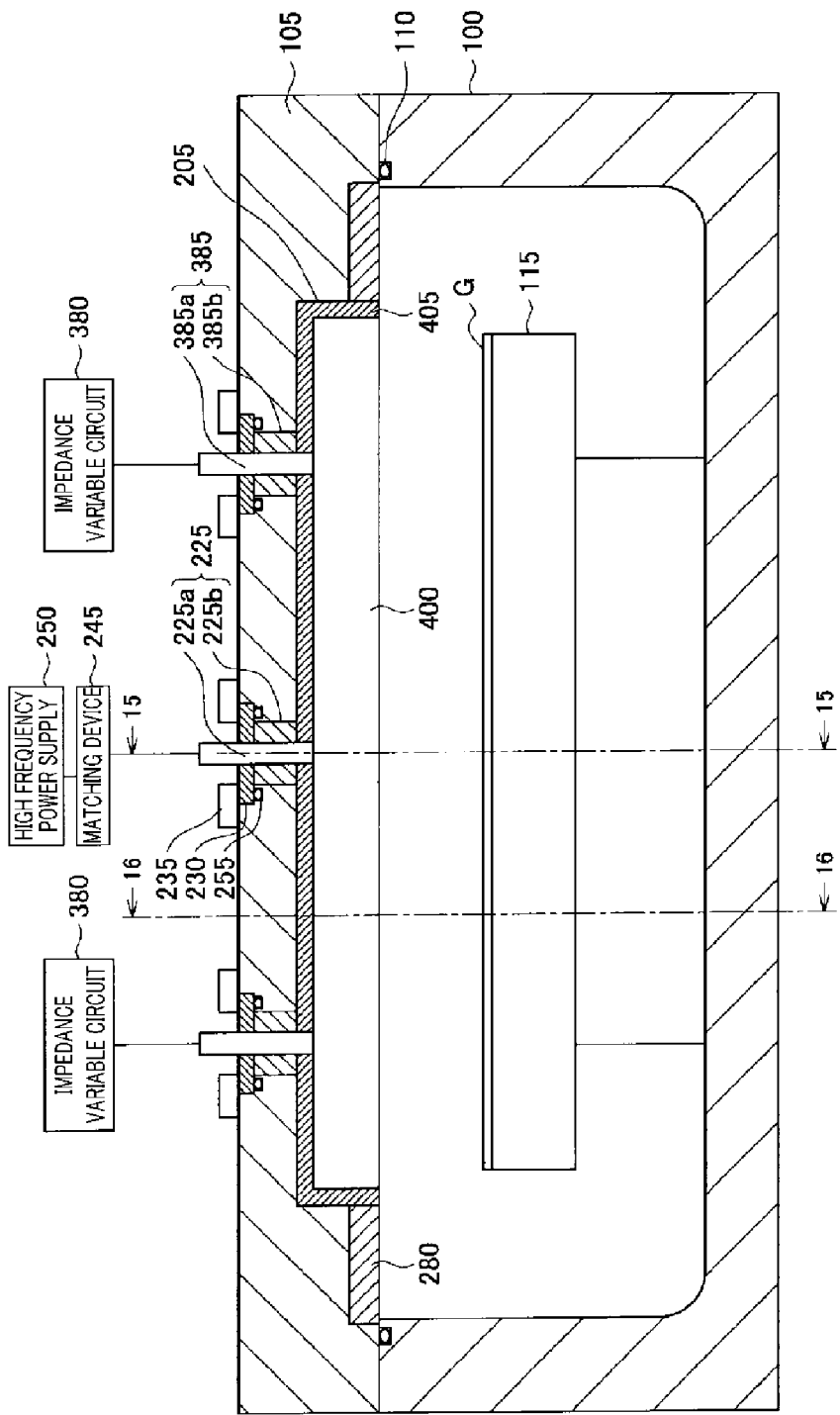
FIG. 17 is a longitudinal cross sectional view (taken along a line 17-17 of FIG. 16) of the plasma processing apparatus in accordance with the fifth illustrative embodiment.

A plasma processing apparatus in accordance with a fifth illustrative embodiment will be explained with reference to longitudinal cross sectional views shown in FIGS. 16 and 17. The left half of FIG. 16 is a cross sectional view taken along a line 16-16 of FIG. 17. The right half of FIG. 16 is a cross sectional view taken along a line 15-15 of FIG. 17. FIG. 17 is a cross sectional view taken along a line 17-17 of FIG. 16.

As shown in FIG. 16, in a bottom surface of the lid 105, four rows of long narrow grooves are formed in a direction perpendicular to the paper plane. An electrode 400 is inserted into each of the 4-row grooves. The electrode 400 is made of a metal such as aluminum alloy. A dielectric member 405 made of alumina or the like is inserted between the electrode 400 and the lid 105. The electrode 400 is fastened while electrically insulated from the lid 105. The space filled with the dielectric member 405 between the electrode 400 and the lid 105 serves as a waveguide path 205 opened toward a plasma space in a slit shape. In the above-described illustrative embodiments, there is provided only one slit-shaped opening for one waveguide path. However, in accordance with the fifth illustrative embodiment, each waveguide path has two openings. The electrode 400 and the lid 105 are provided such that the areas of their plasma exposure surfaces are substantially the same, and the plasma exposure surfaces lie on substantially the same plane.

In an upper central portion of the electrode 400, a coaxial waveguide 225 for supplying a high frequency power is provided. An internal conductor 225$a$ of the coaxial waveguide 225 is connected to a top surface of the electrode 400. An external conductor 225$b$ of the coaxial waveguide 225 is formed as one body with the lid 105. A dielectric material such as quartz is inserted between the internal conductor 225$a$ and the external conductor 225$b$.

The high frequency power supply 250 is connected to an upper portion of the coaxial waveguide 225 via a matching device 245. A high frequency power outputted from the high frequency power supply 250 is supplied to a waveguide path 205 via the matching device 245 and the coaxial waveguide 225. The high frequency power propagates in a direction perpendicular to the paper plane of FIG. 16 and is emitted to a plasma space from the dielectric slit. The high frequency power emitted from the dielectric slit becomes a surface wave and propagates in a bottom surface of the electrode 400 and a bottom surface of the lid 105 in left and right directions in FIG. 16, so that plasma is excited. A gas is supplied from a non-illustrated gas supply source, introduced into the inside of a processing chamber 100 to be used to generate plasma and, then, exhausted through gas exhaust opening 410.

In order to avoid unnecessary plasma excitation outside a plasma excitation region, a side cover 280 made of an insulator such as alumina is provided on an outer periphery of the plasma excitation region. The side cover 280 is inserted in a groove formed in the bottom surface of the lid 105. By providing the side cover 280, a surface wave can be reflected inwardly (toward the plasma excitation region). As a result, it is possible to suppress the surface wave from being propagated outwardly.

Two coaxial waveguides 385 connected to impedance variable circuits 380 are formed at both the ends of the electrode 400, as illustrated in FIG. 17. An internal conductor 385a of each coaxial waveguide 385 is connected to a top surface of the electrode 400. An external conductor 385b of the coaxial waveguide 385 is formed as one body with the lid 105. A dielectric material such as quartz is inserted between the internal conductor 385a and the external conductor 385b.

Configuration examples of the impedance variable circuit 380 are illustrated in FIG. 14. By way of examples, the structure 380a only including the variable capacitor, the structure 380b including the variable capacitor and the coil which are connected in parallel, the structure 380c including the variable capacitor and the coil which are connected in series, or like may be used.

In accordance with the fifth illustrative embodiment as well, it is possible to adjust a guide wavelength of a high frequency power propagating in a waveguide path 205 in a lengthwise direction thereof by controlling reactance of the impedance variable circuit 380, as in the fourth illustrative embodiment. When the reactance of the impedance variable circuit 380 is set to exactly make the waveguide path 205 cut-off, a wavelength of a high frequency power propagating in the waveguide path 205 in the lengthwise direction thereof is sufficiently lengthened, and a uniform electric field is generated in a lengthwise direction of the dielectric slit. In this way, by using the cut-off state of the waveguide path, it is possible to excite uniform plasma in the lengthwise direction of the electrode even with a high frequency in a high frequency band.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

By way of example, in the plasma processing apparatuses in accordance with the foregoing illustrative embodiments, the high frequency power supplies and the matching devices are connected one to one to the multiple number of the coaxial waveguides. However, the illustrative embodiments are not limited thereto. For example, a high frequency power from a single high frequency power supply may be supplied to a multiple number of electrodes after passing through the branched coaxial waveguides. Alternatively, high frequency powers from a single multi-output high frequency power supply may be supplied to the coaxial waveguides via matching devices, respectively. If the multiple number of matching devices are used, each of the matching devices may be controlled independently, or all the matching devices may be controlled in a centralized control manner. The number of the electrode pairs arranged in the widthwise direction and the lengthwise direction of the dielectric slit may not be limited to the foregoing examples. Furthermore, the high frequency power supply may include two high frequency power supplies, i.e., a first high frequency power supply and a second high frequency power supply that outputs a high frequency power having a frequency lower than that of a high frequency power outputted from the first high frequency power supply. In such a configuration, the high frequency power outputted from the first high frequency power supply and having a higher frequency and the high frequency power outputted from the second high frequency power supply and having a lower frequency may be supplied to be overlapped. The number and the position of the coaxial waveguides 225 that applies a high frequency power and is connected to a single electrode pair 200, or the number and the position of the coaxial waveguides 385 that is connected to a single electrode pair 200 and is connected to impedance variable circuits may not also be limited to the foregoing examples. Although in the foregoing examples, the waveguide path 205 and the dielectric plate 210 are arranged perpendicularly to the plasma exposure surfaces A of the electrode members 200a and 200b, they may not be provided perpendicularly but may be bent on the way.

Moreover, the transmission path that connects the high frequency power supply and the electrodes may be, but not limited to, a rectangular waveguide, a coaxial waveguide, a coaxial cable, or a combination of a rectangular waveguide and a coaxial waveguide.

EXPLANATION OF CODES

10: Plasma processing apparatus
100: Vacuum chamber
105: Lid
200: Electrode pair
200a: First electrode member
200b: Second electrode member
205: Waveguide path
210: Dielectric plate
215: Second dielectric cover
220: First dielectric cover
225, 385: Coaxial waveguide
225a1, 225a2, 385a1, 385a2: Internal conductor
225b, 385b: External conductor
245: Matching device
250: High frequency power supply
281: First gas exhaust path
283: Second gas exhaust path
285: Third gas exhaust path
290a: Gas flow path
295a: Coolant path
300: Reflectometer
305: Controller
310: Driving device
320: Metal brush
325a: First waveguide plate
325b: Second waveguide plate
330: First supporting rod
335: Second supporting rod
355: Short-circuit plate
356: Fastening plate
360: Dielectric plunger
380: Impedance variable circuit
400: Electrode 405: Dielectric member
410: Gas exhaust opening

What is claimed is:

1. A plasma processing apparatus comprising:
a decompression chamber that includes therein a mounting table configured to mount a processing target object thereon; and a plasma space in which plasma is generated, the plasma space being formed above the mounting table;
a transmission path comprising a first coaxial waveguide through which a high frequency power for exciting plasma is supplied into the decompression chamber;
a waveguide path, connected to the transmission path, having a slit-shaped opening toward the plasma space;
a matching device which is connected to a high frequency power supply;
an adjusting unit configured to adjust an effective height of the waveguide path and adjust wavelength of a high frequency power propagating in the waveguide path in a lengthwise direction of the slit-shaped opening;
a reflectometer connected to the first coaxial waveguide and configured to measure a reflection or an impedance of a high frequency power propagating in the first coaxial waveguide; and
a controller configured to adjust a wavelength of the high frequency power propagating in the waveguide path in the lengthwise direction of the slit-shaped opening based on the reflection or the impedance measured by the reflectometer,
wherein both ends of the waveguide path in the lengthwise direction of the slit-shaped opening are not short-circuited.

2. The plasma processing apparatus of claim 1,
wherein the adjusting unit is configured to adjust the wavelength of the high frequency power propagating in the waveguide path such that the wavelength of the high frequency power propagating in the waveguide path becomes equal to or larger than about seven times the length of the slit-shaped opening in the lengthwise direction thereof.

3. The plasma processing apparatus of claim 1,
the first coaxial waveguide includes an internal conductor electrically connected to one of two wall surfaces constituting the waveguide path; and an external conductor electrically connected to the other one of the two wall surfaces, and
the internal conductor of the first coaxial waveguide faces a widthwise direction of the slit-shaped opening.

4. The plasma processing apparatus of claim 3, further comprising:
a first dielectric plate inserted into the waveguide path and exposed to the plasma space,
wherein the internal conductor of the first coaxial waveguide penetrates through a hole formed in the first dielectric plate.

5. The plasma processing apparatus of claim 1, further comprising:
a second coaxial waveguide including an internal conductor electrically connected to one of two wall surfaces constituting the waveguide path and an external conductor electrically connected to the other one of the two wall surfaces,
wherein the internal conductor of the second coaxial waveguide faces a widthwise direction of the slit-shaped opening, and
the adjusting unit is an impedance variable circuit connected to the second coaxial waveguide.

6. The plasma processing apparatus of claim 1,
wherein the number of the first coaxial waveguide is one and the number of the second coaxial waveguide is two, and the first coaxial waveguide is disposed between the two second coaxial waveguides.

7. The plasma processing apparatus of claim 1,
wherein the impedance variable circuit is one of a circuit including only a variable capacitor, a circuit including a variable capacitor and a coil that are connected in parallel, or a circuit including a variable capacitor and a coil that are connected in series.

8. The plasma processing apparatus of claim 1,
wherein the adjusting unit comprises:
a metal member that is configured to short-circuit two wall surfaces constituting the waveguide path and faces a widthwise direction of the slit-shaped opening; and
a driving device configured to move the metal member.

9. The plasma processing apparatus of claim 1,
wherein the adjusting unit comprises:
a second dielectric plate inserted into the waveguide path; and
a driving device configured to move the second dielectric plate.

10. The plasma processing apparatus of claim 1,
wherein the controller is configured to adjust the wavelength of the high frequency power propagating in the waveguide path to minimize a reflection of the high frequency power from the first coaxial waveguide.

11. A plasma processing apparatus comprising:
a decompression chamber that includes therein a mounting table configured to mount a processing target object thereon; and a plasma space in which plasma is generated, the plasma space being formed above the mounting table;
a transmission path through which a high frequency power for exciting plasma is supplied into the decompression chamber;
a waveguide path, connected to the transmission path, having a slit-shaped opening toward the plasma space;
an adjusting unit configured to adjust wavelength of a high frequency power propagating in the waveguide path in a lengthwise direction of the slit-shaped opening,
wherein both ends of the waveguide path in the lengthwise direction of the slit-shaped opening are not short-circuited, and
the adjusting unit comprises:
a metal member that is configured to short-circuit two wall surfaces constituting the waveguide path and faces a widthwise direction of the slit-shaped opening; and
a driving device configured to move the metal member.

12. A plasma processing apparatus comprising:
a decompression chamber that includes therein a mounting table configured to mount a processing target object thereon; and a plasma space in which plasma is generated, the plasma space being formed above the mounting table;
a transmission path through which a high frequency power for exciting plasma is supplied into the decompression chamber;
a waveguide path, connected to the transmission path, having a slit-shaped opening toward the plasma space;
an adjusting unit configured to adjust wavelength of a high frequency power propagating in the waveguide path in a lengthwise direction of the slit-shaped opening,
wherein both ends of the waveguide path in the lengthwise direction of the slit-shaped opening are not short-circuited, and the adjusting unit comprises:
a second dielectric plate inserted into the waveguide path; and
a driving device configured to move the second dielectric plate.

13. A plasma processing method using a plasma processing apparatus including a decompression chamber that includes therein a mounting table configured to mount a processing target object thereon, and a plasma space in which plasma is generated, the plasma space being formed above the mounting table; a transmission path through which a high frequency power for exciting plasma is supplied into the decompression chamber; a waveguide path, connected to the transmission path, having a slit-shaped opening toward the plasma space; and an adjusting unit configured to adjust a wavelength of a high frequency power propagating in the waveguide path in a lengthwise direction of the slit-shaped opening the method comprising:

measuring a reflection or an impedance of a high frequency power propagating in a first coaxial waveguide by a reflectometer connected to the first coaxial waveguide; and adjusting a wavelength of the high frequency power propagating in the waveguide path in the lengthwise direction of the slit-shaped opening based on the reflection or the impedance measured by the reflectometer, wherein the plasma processing apparatus further comprises a metal member that is configured to short-circuit two wall surfaces constituting the waveguide path and faces a widthwise direction of the slit-shaped opening, and in the adjusting the wavelength of the high frequency power propagating in the waveguide path, the wavelength of the high frequency power propagating in the waveguide path is adjusted by moving the metal member.

14. A plasma processing method using a plasma processing apparatus including a decompression chamber that includes therein a mounting table configured to mount a processing target object thereon, and a plasma space in which plasma is generated, the plasma space being formed above the mounting table; a transmission path through which a high frequency power for exciting plasma is supplied into the decompression chamber; a waveguide path, connected to the transmission path, having a slit-shaped opening toward the plasma space; and an adjusting unit configured to adjust a wavelength of a high frequency power propagating in the waveguide path in a lengthwise direction of the slit-shaped opening, the method comprising:

measuring a reflection or an impedance of a high frequency power propagating in a first coaxial waveguide by a reflectometer connected to the first coaxial waveguide; and adjusting a wavelength of the high frequency power propagating in the waveguide path in the lengthwise direction of the slit-shaped opening based on the reflection or the impedance measured by the reflectometer, wherein the plasma processing apparatus further comprises a second dielectric plate inserted into the waveguide path, and in the adjusting the wavelength of the high frequency power propagating in the waveguide path, the wavelength of the high frequency power propagating in the waveguide path is adjusted by moving the second dielectric plate.

* * * * *